United States Patent
Timo et al.

(10) Patent No.: US 11,728,851 B2
(45) Date of Patent: Aug. 15, 2023

(54) COMPRESSION AND DECOMPRESSION OF DOWNLINK CHANNEL ESTIMATES

(71) Applicant: Telefonaktiebolaget LM Ericsson (publ), Stockholm (SE)

(72) Inventors: Roy Timo, Järfälla (SE); Sebastian Faxér, Stockholm (SE); Niklas Wernersson, Kungsängen (SE); Simon Järmyr, Skarpnäck (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/878,964

(22) Filed: Aug. 2, 2022

(65) Prior Publication Data

US 2022/0376749 A1 Nov. 24, 2022

Related U.S. Application Data

(63) Continuation of application No. 17/435,178, filed as application No. PCT/SE2019/050196 on Mar. 6, 2019, now Pat. No. 11,509,363.

(51) Int. Cl.
*H04B 7/0452* (2017.01)
*H03M 7/30* (2006.01)
(Continued)

(52) U.S. Cl.
CPC ........ *H04B 7/0452* (2013.01); *H03M 7/3059* (2013.01); *H03M 7/6047* (2013.01);
(Continued)

(58) Field of Classification Search
CPC . H04B 7/0452; H04B 7/0456; H03M 7/3059; H03M 7/6047; H04L 25/4927; H04W 72/042; H04W 72/23
See application file for complete search history.

(56) References Cited

U.S. PATENT DOCUMENTS 9,838,104 B1 12/2017 Zhang et al.
2011/0135021 A1 6/2011 Hatakawa et al.
(Continued)

OTHER PUBLICATIONS

"Activation Functions", ML Glossary documentation, Dec. 31, 2017, 7 pages.
(Continued)

*Primary Examiner* — Vineeta S Panwalkar
(74) *Attorney, Agent, or Firm* — Murphy, Bilak & Homiller, PLLC

(57) ABSTRACT

A network node determines parameters indicating a compression function for compressing downlink channel estimates, and a decompression function. The network node transmits the parameters, receives compressed downlink channel estimates, and decompresses the compressed downlink channel estimates using the decompression function. A terminal device receives the parameters, forms the compression function, compresses downlink channel estimates using the compression function, and transmits the compressed downlink channel estimates. The compression function comprises a first function formed based on at least some of the parameters, a second function which is non-linear, and a quantizer. The first function is configured to receive input data, and to reduce a dimension of the input data. The decompression function comprises a first function configured to receive input data and provide output data in a higher dimensional space than the input data, and a second function which is non-linear.

15 Claims, 10 Drawing Sheets

(51) Int. Cl.
  *H04B 7/0456* (2017.01)
  *H04L 25/49* (2006.01)
  *H04W 72/23* (2023.01)
(52) U.S. Cl.
  CPC ....... *H04B 7/0456* (2013.01); *H04L 25/4927* (2013.01); *H04W 72/23* (2023.01)

(56) References Cited

U.S. PATENT DOCUMENTS

| | | |
|---|---|---|
| 2013/0251011 A1 | 9/2013 | Ventola et al. |
| 2015/0189644 A1 | 7/2015 | Lorca Hernando |
| 2015/0295671 A1 | 10/2015 | Na et al. |
| 2016/0365913 A1 | 12/2016 | Lau et al. |
| 2017/0126437 A1 | 5/2017 | Truong et al. |

OTHER PUBLICATIONS

Jang, Youngrok, et al., "Deep Autoencoder Based CSI Feedback With Feedback Errors and Feedback Delay in FDD Massive MIMO Systems", IEEE Wireless Communications Letters, vol. 8, No. 3, Jun. 2019, 4 pages.

Lu, Chao, et al., "MIMO Channel Information Feedback Using Deep Recurrent Network", IEEE Communication Letters, vol. 23, No. 1, Jan. 2019, 4 pages.

"3GPP TR 38.802 V14.2.0", 3rd Generation Partnership Project; Technical Specification Group Radio Access Network; Study on New Radio Access Technology Physical Layer Aspects (Release 14), Sep. 2017, 1-145.

3GPP, "3GPP TR 38 900 V15.0.0", 3rd Generation Partnership Project; Technical Specification Group Radio Access Network; Study on channel model for frequency spectrum above 6 GHz (Release 15), Jun. 2018, 1-85.

3GPP, "3GPP TR 38.901 V15.0.0", 3rd Generation Partnership Project; Technical Specification Group Radio Access Network; Study on channel model for frequencies from 0.5 to 100 GHz (Release 15), Jun. 2018, 1-91.

3GPP, "3rd Generation Partnership Project; Technical Specification Group Radio Access Network; NR; Physical layer procedures for data (Release 15)", 3GPP TS 38.214 V15.4.0, Dec. 2018, 1-102.

3GPP, "3rd Generation Partnership Project; Technical Specification Group Radio Access Network; NR; Radio Resource Control (RRC) protocol specification (Release 15)", 3GPP TS 38.331 V15.4.0, Dec. 2018, 1-474.

Candès, Emmanuel J., et al., "Robust Uncertainty Principles: Exact Signal Reconstruction From Highly Incomplete Frequency Information", IEEE Transactions on Information Theory, vol. 52, No. 2, Feb. 2006, 1-21.

Ericsson, "IMT2020 self evaluations: On eMBB spectral efficiency with NR", 3GPP TSG-RAN WG1 Meeting #92bis, R1-1805228, Sanya, China, Apr. 16-20, 2018, 1-6.

Ericsson, "Type II CSI feedback", 3GPP TSG-RAN WG1 Meeting #88bis, R1-1705899, Spokane, U.S., Apr. 3-7, 2017, 1-18.

Intel Corporation, "On CSI feedback Type II", 3GPP TSG-RAN WG1 #88bis, R1-1704730, Spokane, USA, Apr. 3-7, 2017, 1-7.

Kuo, Ping-Heng, et al., "Compressive Sensing Based Channel Feedback Protocols for Spatially-Correlated Massive Antenna Arrays", 2012 IEEE Wireless Communications and Networking Conference: PHY and Fundamentals, 2012, 492-497.

Nokia, et al., "CSI feedback overhead reduction for MU-MIMO enhancements", 3GPP TSG RAN WG1 Meeting #95, R1-1813488, Spokane, USA, Nov. 12-16, 2018, 1-10.

Qualcomm Incorporated, "Discussion on advanced CSI reporting and initial evaluation results", 3GPP TSG-RAN WG1 #86, R1-166274, Gothenburg, Sweden, Aug. 22-26, 2016, 1-6.

Wen, Chao-Kai, "Deep Learning for Massive MIMO CSI Feedback", arXiv: 1712.08919v2 [cs.IT], Mar. 4, 2018, 5 pages.

COMPRESSION AND DECOMPRESSION OF DOWNLINK CHANNEL ESTIMATES

RELATED APPLICATIONS

This application is a continuation of U.S. patent application Ser. No. 17/435,178 filed 31 Aug. 2021, which is a National Phase Application of PCT/SE2019/050196 filed 6 Mar. 2019. The entire contents of each aforementioned application is incorporated herein by reference.

TECHNICAL FIELD

The present disclosure generally relates to compression and decompression of downlink channel estimates.

BACKGROUND

Antenna Arrays

All nodes in a 3GPP LTE/5G network can be equipped with arrays of antenna elements to transmit and receive radio signals. FIG. 1 illustrates a uniform linear array (ULA) with 8 co-polarized antenna elements. The 8 co-polarized antenna elements in FIG. 1 are spaced by x wavelengths λ. FIG. 2 illustrates a uniform planar array (UPA) with dual polarized antenna elements regularly arranged into 4 rows and 8 columns. The polarizations are depicted in FIG. 2 using solid and dotted elements. It is now common for LTE deployments to have 4, 8, 16 or even more antenna elements at the base station (BS).

3GPP standards refer to antenna ports, instead of antenna elements. A 3GPP antenna port is a logical entity and is defined such "that the channel over which a symbol on the antenna port is conveyed can be inferred from the channel over which another symbol on the same antenna port is conveyed". Essentially, an antenna port is defined by the reference signal transmitted from the antenna port, where the reference signal can be mapped to the antenna elements (precoded) in an arbitrary fashion. For instance, DMRS antenna ports are precoded in the same way as PDSCH symbols and are typically mapped to the entire antenna while CSI-RS antenna ports are typically either mapped to individual antenna elements or subarrays or are alternatively also precoded in the similar fashion as PDSCH. It is common practice to partition an antenna array into subarrays of physical antenna elements, where only a single transmit-receive unit (TXRU) is connected to each subarray. That is, each antenna element of the subarray is fed the same input signal but with a fixed phase and or amplitude offset. Thus, depending on context, a 3GPP antenna port can be a single physical antenna element, a subarray of physical antenna elements or a general linear combination of the antenna elements of the array. The new radio (NR) release 15 standard supports up to 32 digitally-precoded CSI-RS antenna ports. The number of antenna elements is expected to grow significantly in future evolutions of 3GPP 5G networks, particularly at the BS.

One of 3GPP's key strategies to improve system performance (e.g., spectral efficiency) in 5G networks is to enable BSs to efficiently use large antenna arrays (e.g., as a single array or multiple panels of smaller arrays).

Let $N_{TX}$=number of antenna ports at the BS $N_{RX}$=number of antenna ports at the UE The mapping from antenna ports to antenna elements is called an antenna virtualization.

Downlink Channel Model

The input to each antenna port is a sequence of complex-valued modulation symbols (e.g., QPSK, 16QAM, 64QAM or 256QAM). Orthogonal frequency division multiplexing (OFDM) is used in LTE/5G networks to encode these symbols onto many orthogonal subcarriers for transmission.

The propagation channel connecting a network node (such as a BS) with some terminal device (such as a user equipment (UE)) describes how the OFDM symbols transmitted from the BS's antenna ports are distorted by the surrounding environment (buildings, trees, vehicles etc.) and received by the UE's antenna ports. The channel experienced by an OFDM resource element in LTE/5G networks is well-modeled by $$y = Hx + z.$$

Here y is an ($N_{RX}$×1) complex vector representing the signals measured on the UE's antenna ports.

x is an ($N_{TX}$×1) complex vector representing the signals sent from the BS's antenna ports.

H is an ($N_{RX}$×$N_{TX}$) complex matrix representing the channel for a given OFDM resource element connecting the BS's antenna array with the UE's antenna array. The (i,j)-th element of H, which we denote by $h_{ij}$, models the complex gain of the signal path between the j-th antenna port at the BS and the i-th antenna port at the UE.

z is an ($N_{RX}$×1) complex vector representing the representing noise in the UE's receiver radio-frequency chain.

The channel matrix H for a given OFDM resource element (RE) encapsulates many unknown or unmeasurable variables, so it is appropriate to model it as random. An OFDM channel model for a deployment scenario, in the context of this invention, is a model for the joint distribution of the OFDM channel matrices over REs, OFDM symbols, and UEs. For example, the channel modeling work in 3GPP TR 38.901 V15.0.0 and 3GPP TR 38.900 V15.0.0 aim to provide realistic channel models for the following basic deployment scenarios:

Urban micro scenario: Models outdoor-to-outdoor and outdoor-to-indoor communications links, assuming the BSs are mounted below surrounding rooftops. Example, the typical open area is 50 to 100 m; the BS height is 10 m; the UE height is 1.5 to 2 meters; and the inter-site distance is 200 m.

Urban macro scenario: Models outdoor-to-outdoor and outdoor-to-indoor communications links, assuming the BSs are mounted above surrounding rooftops. Example, the BS height is 25 m; the UE height is 1.5 to 2 meters; and the inter-site distance is 500 m.

Indoor scenario: Models typical indoor deployment scenarios, including office environments and shopping malls. Example: The BSs are mounted at a height of 2-3 m either on the ceilings or walls. The shopping malls are often 1-5 stories high and may include an open area (or "atrium") shared by several floors.

Backhaul scenario: Models outdoor above roof top backhaul in an urban area, where small cells are placed on lamp posts.

D2D/V2V scenario: Models device-to-device and vehicle-to-vehicle deployments.

Other important factors that are often explicitly modeled are the carrier frequency, the OFDM subcarrier spacing, the antenna/device configuration at the UE and BS (e.g., number of panels, panel spacing, number of elements within each panel and layout), and the device mobility (e.g., walking or driving).

No single channel model can accurately model the OFDM channel matrices for all real-world deployments. The OFDM channels observed in a real-world deployment are generated by a unique combination of, for example, the physical surroundings, radio equipment, and device mobility.

Active Antenna Systems and CSI at the BS

Active antenna systems are a key technology in modern LTE networks, and they will become more important in future 5G networks. For example, a key differentiator between LTE and 5G networks will be the number of supported antenna ports: 5G networks will support much larger antenna arrays to enable new "massive" MIMO precoding/beamforming strategies that aim to provide, among other things, the following gains:

enhanced beamforming gains for SU-MIMO systems (e.g., improve receive power at a desired UE, and simultaneously reduce interference to other UEs);

enhanced spatial multiplexing for SU-MIMO systems (e.g., improve throughput and/or reliability by spatially multiplexing two-or-more data-streams to a desired UE on individual OFDM resource blocks), and enhanced MU-MIMO capabilities (e.g., improve spectral efficiency by spatially multiplexing two-or-more UEs on individual OFDM resource blocks).

Advanced MIMO precoding/beamforming techniques require accurate knowledge of the channel H at the BSs and/or an interference-plus-noise covariance matrix $\Sigma_z$.

Poor channel state information (CSI) at a BS significantly limits its ability to accurately beamform and spatially multiplex data.

Time division duplex (TDD) network deployments in which uplink-downlink channel reciprocity holds are an ideal candidate for 5G systems and MIMO precoding/beamforming. Uplink-downlink channel reciprocity implies that the BS can directly estimate the downlink channels from uplink reference signals (e.g., SRS).

If uplink-downlink channel reciprocity holds, then it is sometimes possible for the BS to obtain accurate CSI with relatively small (uplink spectral efficiency) cost to the network.

Uplink-downlink channel reciprocity will not hold for all deployments. For example, channel reciprocity does not hold for frequency division duplex (FDD) deployments, where uplink and downlink transmissions occur on different carriers. FDD deployments are often required for coverage, legacy and regulatory reasons.

Uplink-downlink reciprocity does not hold for all TDD systems either. For example, UEs have much smaller transmit power capabilities (due to regulatory and battery limitations), and, therefore, the coverage of uplink reference signals (e.g., SRS) is much smaller than the coverage of downlink reference signals (e.g., CSI-RS). Moreover, the Rel. 15 standard mandates the use of 4 antenna ports for downlink reception, but only one antenna for uplink transmission. Thus, at least in the current standard, there may be a sounding mismatch between the uplink and downlink.

Full uplink-downlink channel reciprocity will for example not hold for all 5G deployments.

If uplink-downlink channel reciprocity does not hold, then the BS can obtain CSI via 3GPP's standardized channel state information (CSI) feedback reporting mechanisms. The basic idea underlying these reporting mechanisms can be described as follows:

The BS transmits downlink reference signals (e.g., CSI-RS).

The UEs estimate their channels (or important parameters thereof) using the downlink reference signals.

The UEs send CSI reports over the uplink to the BS.

CSI Feedback: Raw Channel Measurements

It is not possible for the UEs to include "raw" downlink channel estimates in its CSI reports—the resulting overhead would simply suffocate the uplink.

As an example, suppose that we have a network configured to operate with a 10 MHz LTE carrier and 9 subbands, which is a common LTE deployment. Further suppose that we have a BS with $N_{TX}$=64 antenna ports and a UE with 4 antenna ports. The number of complex channel matrix coefficients is then $N_{TX}N_{RX}N_{SB}$=64×4×9=2304. If the UE quantizes each coefficient using 10 bits and the network uses a 10 msec CSI reporting period, then resulting uplink CSI overhead would be 2304*10*100=2.304 Mbps (or, equivalently, 0.2304 bps/Hz spectral efficiency). As a benchmark, the ITM2020 minimum uplink cell-edge spectral efficiency requirements are defined as follows (Ericsson, 2018):

5G dense urban macro-layer deployments (200 m ISD, 39 AP, 4 GHz)=0.225 bps/Hz 5G rural (1732 m ISD, 39AP, 4 GHz)=0.12 bps/Hz 5G indoor hotspot (20 m ISD, 12 Aps, 30 GHz)=0.3 bps/Hz.

It is not possible to include raw channel matrix estimates (or channel covariance matrix estimates) and achieve reasonable quantization accuracy in the uplink CSI reports.

CSI Feedback: 3GPP Implicit Type I and Type II

To reduce uplink overhead, 3GPP LTE and 5G networks only require UEs to feedback CSI that is relevant to the upcoming scheduling decisions at the serving BS. The basic principle of the NR CSI feedback is as follows. The BS first configures the UE's CSI report. This configuration may specify the time- and frequency-resources that can be used by the UE to report CSI as well as what information should be reported. For example, the CSI report can consist of a channel quality indicator (CQI), precoding matrix indicator (PMI), CSI-RS resource indicator (CRI), strongest layer indication (SLI), rank indicator (RI), and/or L1-RSRP.

3GPP Release 15 specifies two types of CSI reports, each utilizing different ways to calculate the PMI (i.e. different "codebooks")

Type I CSI feedback, and

Type II CSI feedback.

Type I CSI feedback has been designed as a low-feedback overhead technology, primarily for SU-MIMO scenarios. The Type I precoder codebooks are based on DFT vectors, where a spatial layer of the precoder only utilizes a single DFT vector, corresponding to only the strongest angular direction of the channel. Thus, such a codebook may be seen as a spatial downsampling of the channel.

Type-I feedback is mostly useful for SU-MIMO operation. To enable more advanced features (e.g., non-linear precoding or MU-MIMO), more advanced MIMO precoding techniques are required. These techniques require more detailed channel knowledge at the BS.

Type II CSI feedback has been designed to provide higher resolution channel knowledge at the BS, albeit with higher feedback overhead. It is envisaged that Type-II CSI will enable the BS to perform more advanced MU-MIMO precoding techniques (such as zero-forcing and regularized zero-forcing) needed for MU-MIMO.

According to 3GPP TR 38.802 V14.2.0, type II feedback consists of explicit feedback and/or codebook-based feedback with higher spatial resolution. At least one scheme from Category 1, 2 and/or 3 for Type II CSI is supported. Category 1 is described below as an example. Categories 2 and 3 are not described herein.

Category 1: Precoder feedback based on linear combination codebook dual-stage $W=W_1W_2$. Here codebook $W_1$ consists of a set of L orthogonal beams taken from the 2D DFT matrix. The set of L beams is selected out of a basis composed of oversampled 2D DFT beams, where $L \in \{2, 3, 4\}$ (L is configurable) and beam selection is wideband. As for $W_2$: The L beams are combined in $W_2$ with common $W_1$ subband reporting of phase quantization of beam combining coefficients (configurable between QPSK and 8-PSK phase related information quantization). Beam amplitude scaling quantization can be configured for wideband or subband reporting.

Category 1 CSI feedback will only provide high resolution channel state information if most of the channel's energy is contained within L DFT basis vectors. Or, put another way, the channel needs to be L-sparse with respect to the DFT unitary rotation. Not all channels for all deployments are sparse with respect to the DFT matrix.

CSI Feedback: Channel Averaging

Instead of feeding-back raw channel estimates over the uplink, the UE can send averages of these channel estimates over several subbands (or resource blocks). For example, in an example scenario with 9 subbands, it is possible to reduce the uplink overhead by a factor of 9 by averaging the channels over all 9 subbands.

Let $H_1, H_2, \ldots, H_{N_{SB}}$ denote the channels of a single UE over $N_{SB}$ subbands. Let $$R_{TX} := \frac{1}{N} \sum_{n=1}^{N_{RB}} H_n^* H_n$$

and $$R_{RX} := \frac{1}{N} \sum_{n=1}^{N_{SB}} H_n H_n^*$$

respectively denote the sample average transmitter-side and receiver-side covariance matrices. Let $R_{TX} = V \Sigma V^*$ and $R_{RX} = U \Sigma U^*$ denote the corresponding singular value decomposition of the above sample covariance matrices. Let $U[1: N_{RX}, :]$ denote the first $N_{RX}$ singular vectors in U, and suppose that $U[1: N_{RX}, :]$ and V are feedback to the BS over the uplink. The BS can then approximate the average channel by $$\hat{H} := U[1:N_{RX},:]\sqrt{\Sigma}V^*$$

Channel averaging over the entire bandwidth is required to reduce uplink overhead to a feasible level. However, such extreme averaging leads to poor downlink performance (the spatial information contained within the channel covariance matrix of a given subband is averaged-out). Further, the UE is required to perform singular-value matrix decompositions of the transmitter- and receiver-side sample covariance matrices $R_{TX}$ and $R_{RX}$ for every CSI report (e.g. every 10 msecs). The complexity of this decomposition for an (m×n) matrix is approximately $O(mn^2)$, which is a non-trivial computational and energy cost on the UE.

CSI Feedback: Transform-Domain Dimensionality Reduction

It is often possible to transform the channel matrices into a "sparse basis" where most of the channel's energy is concentrated in a few important dimensions. The Discrete Fourier Transform (DFT) is a commonly used transform:

The DFT matrix is a unitary transform, and line-of-sight channels are approximately sparse under this transform (rich scattering non-LoS channels are not sparse under the DFT transformation). Other transforms include the Discrete Cosine Transform (DCT) and various eigen-decompositions.

CSI Feedback: Compressive-Sensing Dimensionality Reduction

If the channels are sparse in some basis, but the exact sparse basis is not known, then it is possible to use compressive-sensing techniques (Candes, Romberg, & Tao, 2006) to automatically find and exploit the channel's sparseness (Kuo, Kung, & Ting, 2012). The basic idea of compressed sensing is to take random linear projections of the channel: If the number of random projections exceeds the "sparsity" of the channel, then it is possible to reconstruct the channel to within an arbitrarily small error (the reconstruction fidelity is guaranteed by the restricted isometry property).

Decompressing the random linear projections in compressed sensing requires the BS to solve computationally expensive convex optimization problems; for example, the complexity of recovering a vector of size n using the basis pursuit algorithm is $O(n^3)$. If CS is used for each uplink CSI report, then the BS will need to solve many such optimizations approximately every 10 msec. This is a non-trivial computational cost, when compared to similar operations (e.g., linear transmitter-side beam forming and linear receiver filtering).

The computational requirements of such CS reconstruction algorithms would increase the hardware requirements and cost of each BS and would add significant decoding latency.

Conclusion

As described above, several ways have been proposed for how a terminal device (such as a UE) may convey information about downlink channel estimates to a network node. However, in order to address one or more of the abovementioned issues, it would be desirable to provide a new way to convey information about downlink channel estimates.

SUMMARY

Embodiments of methods, terminal devices, network nodes, computer programs, computer program products, and non-transitory computer-readable media are provided herein for addressing one or more of the abovementioned issues.

Hence, a first aspect provides embodiments of a method of operating a terminal device. The method comprises receiving a first set of parameters, forming a compression function based on the first set of parameters, compressing downlink channel estimates using the compression function, and transmitting the compressed downlink channel estimates. The compression function comprises a first function, a second function, and a quantizer. The first function is formed based on at least some of the parameters from the first set of parameters. The first function is configured to receive input data, and to reduce a dimension of the input data. The second function is a non-linear function.

It will be appreciated that the first set of parameters comprises multiple parameters.

It will be appreciated that the compression function is employed to convert or transform the downlink channel estimates into a compressed format or representation.

Different compression functions may be suitable for compression of the downlink channel estimates, for example depending on factors such as properties of the terminal device itself, and/or properties of a device (such as a network node) which is intended to receive the compressed downlink channel estimates. Since the compression function is formed based on the first set of parameters, these parameters may be employed to control which compression function to be used at the terminal device.

A second aspect provides embodiments of a method of operating a network node. The method comprises determining a first set of parameters. The first set of parameters indicates a compression function for compressing downlink channel estimates at a terminal device. The method comprises determining a decompression function for decompressing downlink channel estimates which have been compressed by the terminal device using the compression function. The method comprises transmitting the first set of parameters, receiving compressed downlink channel estimates, and decompressing the compressed downlink channel estimates using the decompression function. The decompression function comprises a first function, and a second function. Determining the decompression function comprises determining the first function. The first function is configured to receive input data and to provide output data in a higher dimensional space than the input data. The second function is a non-linear function.

It will be appreciated that the decompression function is employed to reconstruct or recreate the downlink channel estimates from the compressed format or representation. It will also be appreciated that this recreation or reconstruction may not be perfect. In other words, the decompressed downlink channel estimates (in other words, the downlink channel estimates as reconstructed or recreated at the network node) may deviate from the original downlink channel estimates which were compressed before being received by the network node.

A third aspect provides embodiments of a terminal device. The terminal device is configured to receive a first set of parameters, form a compression function based on the first set of parameters, compress downlink channel estimates using the compression function, and transmit the compressed downlink channel estimates. The compression function comprises a first function, a second function, and a quantizer. The terminal device is configured to form the first function based on at least some of the parameters from the first set of parameters. The first function is configured to receive input data, and to reduce a dimension of the input data. The second function is a non-linear function.

The terminal device may for example be configured to perform the method as defined in any of the embodiments of the first aspect disclosed herein (in other words, in the claims, or the summary, or the detailed description, or the drawings).

The terminal device may for example comprise processing circuitry and at least one memory. The at least one memory may for example contain instructions executable by the processing circuitry whereby the terminal device is operable to perform the method as defined in any of the embodiments of the first aspect disclosed herein.

A fourth aspect provides embodiments of a network node. The network node is configured to determine a first set of parameters. The first set of parameters indicates a compression function for compressing downlink channel estimates at a terminal device. The network node is configured to determine a decompression function for decompressing downlink channel estimates which have been compressed by the terminal device using the compression function. The network node is configured to transmit the first set of parameters, receive compressed downlink channel estimates, and decompress the compressed downlink channel estimates using the decompression function. The decompression function comprises a first function, and a second function. The network node is configured to determine the decompression function by at least determining the first function. The first function is configured to receive input data and to provide output data in a higher dimensional space than the input data. The second function is a non-linear function.

The network node may for example be configured to perform the method as defined in any of the embodiments of the second aspect disclosed herein (in other words, in the claims, or the summary, or the detailed description, or the drawings).

The network node may for example comprise processing circuitry and at least one memory. The at least one memory may for example contain instructions executable by the processing circuitry whereby the network node is operable to perform the method as defined in any of the embodiments of the second aspect disclosed herein.

A fifth aspect provides embodiments of system comprising a terminal device as defined in any of the embodiments of the third aspect disclosed herein and a network node as defined in any of the embodiments of the fourth aspect disclosed herein.

A sixth aspect provides embodiments of a computer program comprising instructions which, when executed by a computer, cause the computer to perform the method of any of the embodiments of the first aspect disclosed herein.

A seventh aspect provides embodiments of a computer program product comprising a non-transitory computer-readable medium, storing instructions which, when executed by a computer, cause the computer to perform the method of any of the embodiments of the first aspect disclosed herein.

An eighth aspect provides embodiments of a non-transitory computer-readable medium storing instructions which, when executed by a computer, cause the computer to perform the method of any of the embodiments of the first aspect disclosed herein.

A ninth aspect provides embodiments of a computer program comprising instructions which, when executed by a computer, cause the computer to perform the method of any of the embodiments of the second aspect disclosed herein.

A tenth aspect provides embodiments of a computer program product comprising a non-transitory computer-readable medium, storing instructions which, when executed by a computer, cause the computer to perform the method of any of the embodiments of the second aspect disclosed herein.

An eleventh aspect provides embodiments of a non-transitory computer-readable medium storing instructions which, when executed by a computer, cause the computer to perform the method of any of the embodiments of the second aspect disclosed herein.

The effects and/or advantages presented in the present disclosure for embodiments of the method according to the first aspect may also apply to corresponding embodiments of the method according to the second aspect, the terminal device according to the third aspect, the network node according to the fourth aspect, the system according to the fifth aspect, the computer program according to the sixth or ninth aspect, the computer program product according to the seventh or tenth aspect, and the non-transitory computer-readable medium according to the eighth or eleventh aspect. Similarly, the effects and/or advantages presented in the present disclosure for embodiments of the method according to the second aspect may also apply to corresponding embodiments of the method according to the first aspect, the terminal device according to the third aspect, the network node according to the fourth aspect, the system according to the fifth aspect, the computer program according to the sixth or ninth aspect, the computer program product according to the seventh or tenth aspect, and the non-transitory computer-readable medium according to the eighth or eleventh aspect.

It is noted that embodiments of the present disclosure relate to all possible combinations of features recited in the claims.

BRIEF DESCRIPTION OF THE DRAWINGS

In what follows, example embodiments will be described in greater detail with reference to the accompanying drawings, on which.

All the figures are schematic, not necessarily to scale, and generally only show parts which are necessary in order to elucidate the respective embodiments, whereas other parts may be omitted or merely suggested. Any reference number appearing in multiple drawings refers to the same object or feature throughout the drawings, unless otherwise indicated.

DETAILED DESCRIPTION

1. Problems with Existing Solutions

3GPP networks have standardized Type-I and Type-II CSI feedback.

Type-I CSI feedback has a low uplink overhead cost, but it cannot be used for advanced downlink precoding (e.g., MU-MIMO precoding and SU non-linear precoding).

Type-II CSI feedback provides more detailed CSI knowledge to the BS with increased uplink overhead. Type-II CSI requires the UE to report the L strongest projections of the channel matrix onto a standardized 2D DFT precoding/beamforming matrix. The 2D DFT matrix exploits the structure of the BS's ULA or UPA. If the antenna ports on the ULA or UPA are not perfectly spaced (e.g., 0.5 wavelength for a ULA), and/or the array is operated at several different frequencies, and/or the array is not perfect calibrated, and/or, the array has severe mutual coupling or other types of impairments, then the ULA/UPA model is not perfectly accurate anymore and the sparsity of the DFT basis may be destroyed.

A channel state (CS) compression method that is robust to changes/imperfections in the BS's array would be preferable.

Other explicit CSI feedback techniques are channel averaging, sparse transforms, and compressive sensing. These methods are not currently suitable for practical networks. Some shortcomings are discussed in the background section.

Moreover, the transform-domain approach described in the background section implicitly assumes that an appropriate "sparse basis" for the UEs exists and is known for a given deployment. Unfortunately, in practice, it is unlikely that the channels across different deployments, operating in vastly different environments with different equipment, will exhibit the same (or similar) sparsity properties. Indeed, 5G supports many new use cases and UE types (e.g., drones, cars, IoT devices) with different antenna configurations and channel conditions.

Figure 1:
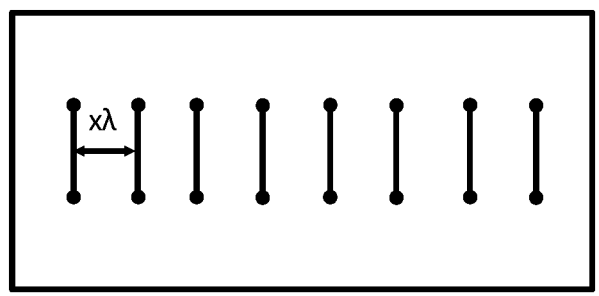
FIG. 1 shows an example uniform linear array of antenna elements.
Figure 2:
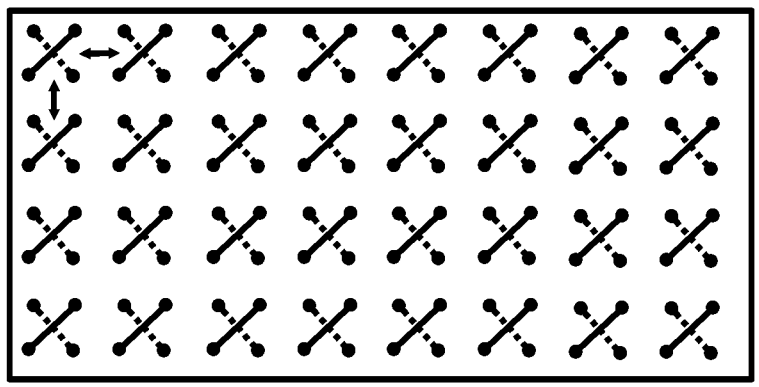
FIG. 2 shows an example uniform planar array of antenna elements.
Figure 3:
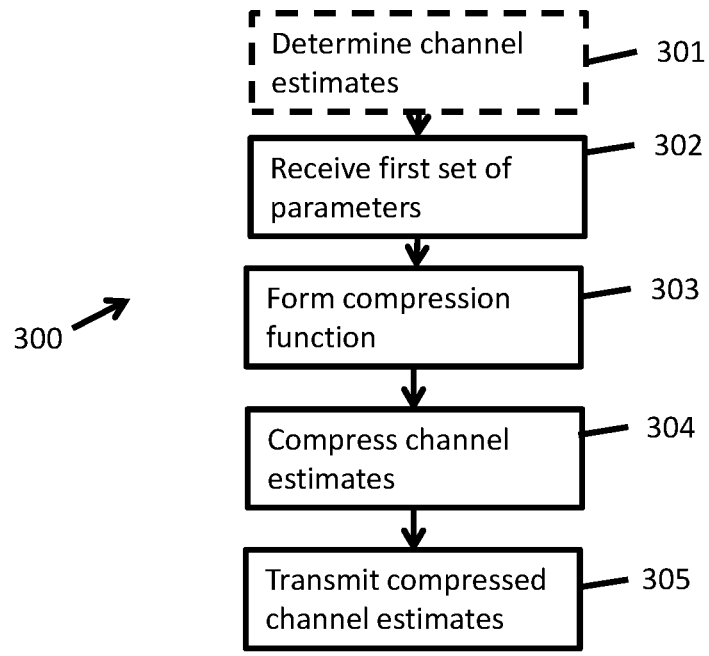
FIG. 3 is a flow chart a method of operating a terminal device, according to an embodiment.

2. General Embodiments of Methods of Operating a Terminal Device and Methods of Operating or a Network Node FIG. 3 is a flow chart a method 300 of operating a terminal device, according to an embodiment. The terminal device may for example be referred to as a communication device. The terminal device may for example be a user equipment (UE). UE refers to any type of wireless device communicating with a network node and/or with another UE in a cellular or mobile communication system. Examples of UE are target device, device to device (D2D) UE, V2X UE, ProSe UE, machine type UE or UE capable of machine to machine (M2M) communication, PDA, iPAD, Tablet, mobile terminals, smart phone, laptop embedded equipped (LEE), laptop mounted equipment (LME), USB dongles etc. Example implementations of a terminal device will be described further below with reference to FIG. 16.

The method 300 comprises receiving 302 a first set of parameters. The first set of parameters comprises multiple parameters, for example in the form of real or complex numbers. In some of the examples presented below, the first set of parameters is denoted by a. The first set of parameters may for example be received 302 via radio resource control (RRC). The first set of parameters may for example be configured/selected by a network node and communicated to the terminal device using a CSI report configuration via the RRC protocol (3GPP TS 38.331 V15.4.0).

The method 300 comprises forming (or generating) 303 a compression function (which may also be referred to as a compressor) based on the first set of parameters, and compressing 304 downlink channel estimates using the compression function. In other words, the compression function is employed to compress the downlink channel estimates into a more compact or bitrate-efficient format or representation. The downlink channel estimates may for example be compressed jointly or together, rather than being compressed individually.

The method 300 comprises transmitting 305 the compressed downlink channel estimates. The compressed downlink channel estimates may for example be transmitted 305 via Physical Uplink Shared Channel (PUSCH) or Physical Uplink Control Channel (PUCCH) to a network node.

The compression function formed or generated at step 303 comprises a first function, a second function, and a quantizer (which may also be referred to as a quantization function). In other words, using the compression function at step 304 comprises using the first function, the second function and the quantizer. The first function, the second function, and the quantizer may for example be regarded as parts or subfunctions of the compression function. The second function is a non-linear function. The quantizer is configured to perform quantization.

The first function is formed based on at least some of the parameters from the first set of parameters. In other words, the first function is not predefined, and can be at least partially controlled via the first set of parameters. The first function is configured to receive input data, and to reduce a dimension of the input data. In other words, data of a first dimension may be inserted into the first function and may be reduced by the first function into data of a second dimension which is lower than the first dimension.

The first function serves to reduce a dimensionality of the downlink channel estimates. Different compression functions may be suitable for compression of the downlink channel estimates, for example depending on factors such as properties of the terminal device itself, and/or properties of a device (such as a network node) which is intended to receive the compressed downlink channel estimates. Since the compression function is formed based on the first set of parameters, these parameters may be employed to control which compression function to be used at the terminal device. As described below (see for example the autoencoder example described below with reference to FIG. 15), the second function may for example enhance a training process to find suitable values for the first set of parameters (and thereby also a suitable compression function). For example, such training may be enhanced compared to a situation where only linear functions are employed in the compression function. For example, suitable values for the first set of parameters can be found (or optimized) by a network node during a training process. The resulting compression performance (such as the fidelity of downlink channel estimates reconstructed at the network node after having been compressed at the terminal device using the compression function) of the optimized first parameters will depend on the choice of the second function. The second function introduces nonlinearities into the compression function that allow the downlink channel estimates to be better approximated (see for example the performance described below with reference to FIG. 17). The quantizer serves to provide output data that can be transmitted using a finite number of bits.

The downlink channel estimates to be compressed at the step 304 may for example be determined 301 as part of the method 300. For example, the method 300 may comprise determining 301 the downlink channel estimates using downlink reference signals.

Figure 4:
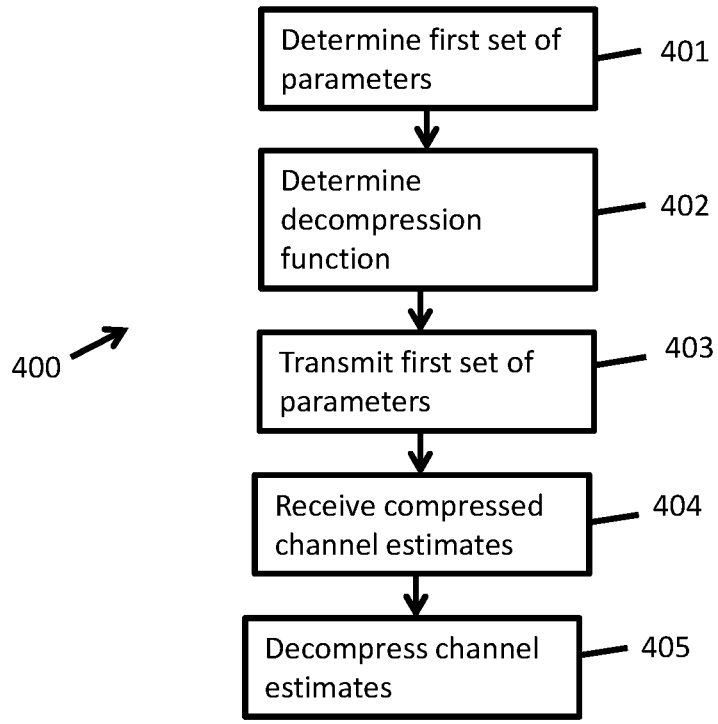
FIG. 4 is a flow chart a method of operating a network node, according to an embodiment.

FIG. 4 is a flow chart a method 400 of operating a network node, according to an embodiment. The network node may for example be referred to as a base station and may correspond to any type of radio network node or any network node, which communicates with a terminal device (or UE) and/or with another network node. Examples of network nodes are NodeB, base station (BS), multi-standard radio (MSR) radio node such as MSR BS, eNodeB, gNodeB. MeNB, SeNB, network controller, radio network controller (RNC), base station controller (BSC), road side unit (RSU), relay, donor node controlling relay, base transceiver station (BTS), access point (AP), transmission points, transmission nodes, RRU, RRH, nodes in distributed antenna system (DAS), core network node (e.g. MSC, MME etc), O&M, OSS, SON, positioning node (e.g. E-SMLC) etc. Example implementations of the network node will be described further below with reference to FIG. 16.

The method 400 comprises determining 401 a first set of parameters. The first set of parameters indicates a compression function for compressing downlink channel estimates at a terminal device. The first set of parameters is the same set of parameters as the first set of parameters received at step 302 of the method 300.

The method 400 comprises determining 402 a decompression function (which may also be referred to as a decompressor) for decompressing downlink channel estimates which have been compressed by the terminal device using the compression function. In other words, the decompression function is determined so as to be suitable for use together with the compression function.

The method 400 comprises transmitting 403 the first set of parameters. The first set of parameters may for example be transmitted 403 via radio resource control (RRC) to a terminal device.

The method 400 comprises receiving 404 compressed downlink channel estimates, and decompressing 405 the compressed downlink channel estimates using the decompression function. In other words, the decompression function is employed to reconstruct or recreate downlink channel estimates which have been compressed at a terminal device. It will be appreciated that the reconstruction of the downlink channel estimates may not be perfect, and that the downlink channel estimates as reconstructed may deviate from the original downlink channel estimates. The compressed downlink channel estimates are the same as those transmitted at step 304 in the method 300.

The decompression function determined at step 402 comprises a first function and a second function. In other words, using the decompression function comprises using the first function and the second function of the decompression function. The first function and the second function of the decompression function may for example be regarded as parts or subfunctions of the decompression function. The first function and the second function of the decompression function typically do not coincide with the first function and the second function of the compression function formed at step 302 of the method 300.

The step 402 of determining the decompression function comprises determining the first function of the decompression function. In other words, the first function of the decompression function is not predefined.

The first function of the decompression function is configured to receive input data and to provide output data in a higher dimensional space than the input data. In other words, the first function is configured to receive data of a first dimension, for example in the form of N real numbers, and to output data in a space of a second dimension which is higher than the first dimension, for example in the form of M real numbers where M is larger than N.

The second function of the decompression function is a non-linear function.

As described above, different compression functions may be suitable for compression of the downlink channel estimates, for example depending on factors such as properties of the terminal device itself, and/or properties of a device (such as a network node) which is intended to receive the compressed downlink channel estimates. In the method 400, the network node may determine which compression function to be employed at a terminal device, and may signal this to the terminal device via the first set of parameters.

In analogy with the second function of the compression function formed at step 303 of the method 300, the second function of the decompression function may for example enhance a training process to find a suitable decompression function. For example, such training may be enhanced compared to a situation where only linear functions are employed in the decompression function. For example, a suitable compression function and a suitable decompression function can be found (or optimized) by a network node during a training process. The resulting compression performance (such as the fidelity of downlink channel estimates reconstructed at the network node after having been compressed at the terminal device using the compression function) of the compression function and decompression function will depend on the choice of the second function of the decompression function. The second function of the decompression function introduces nonlinearities into the decompression function that allow the downlink channel estimates to be better approximated.

Figure 5:
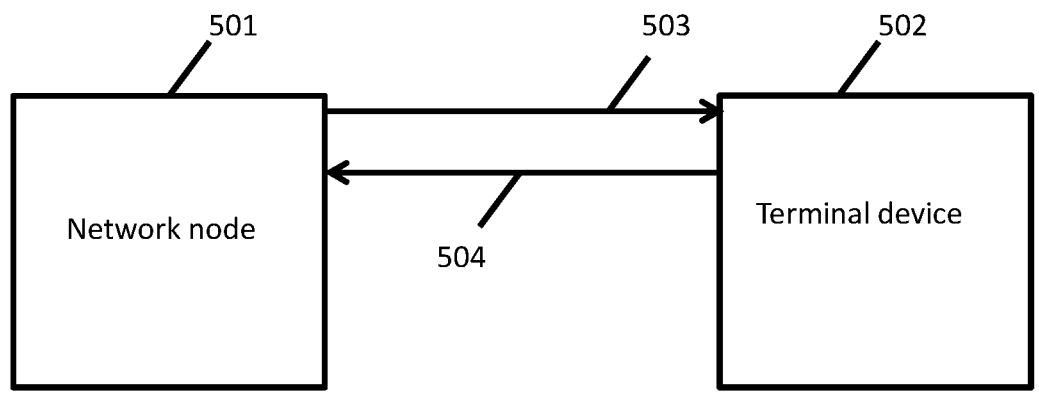
FIG. 5 shows signals transmitted between a network node and a terminal device, according to an embodiment.

FIG. 5 shows signals transmitted between a network node 501 and a terminal device 502, when the network node 501 performs the method 400 described above with reference to FIG. 4 and the terminal device 502 performs the method 300 described above with reference to FIG. 3. Hence, the network node 501 transmits 403 the first set of parameters 503, and the terminal device 502 receives it. The terminal device 502 transmits 305 the compressed downlink channel estimates 504, and the network node 501 received them.

According to some embodiments, the downlink channel estimates (which are compressed at step 304 of the method 300) comprise information about channels from antenna ports of the network node 501 to antenna ports of the terminal device 502. The downlink channel estimates may for example include the matrix H and/or the vector z described above in the background section. The downlink channel estimates may for example include a rank indicator (RI) and/or a channel quality indicator (CQI).

According to some embodiments, the second function of the compression function and/or the second function of the decompression function may comprise a non-linear activation function. Activation functions are often employed in machine learning, such as neural networks. An activation function may provide a "threshold" that allows things to be "tuned on" (i.e. activated) or "turned off" (i.e. deactivated).

The activation function may be a scalar non-linear function (i.e., $y=f(x)$ where x and y are real numbers). A simple example might be $f(x)=0$ if $x<=0$ and $f(x)=1$ if $x>0$. This function turns x off whenever it is negative. Another example is the sigmoid function function. The activation function comprised in the compression function may for example be the same activation function as the activation function comprised in the decompression function, or these two activation functions may be different activation functions.

According to some embodiments, the second function of the compression function and/or the second function of the decompression function are predefined. In other words, the second function of the compression function and/or the second function of the decompression may be known in advance by the terminal device and/or the network node.

According to some embodiments, the first function of the compression function is configured to output a plurality of numbers, and the second function of the compression function is configured to apply a scalar non-linear function to each of the plurality of numbers. The scalar non-linear function may for example be an activation function. An explicit example implementation of such first and second functions are the functions 1508 and 1511 in the autoencoder example described below with reference to FIG. 15.

According to some embodiments, the first function of the decompression function is configured to output a plurality of numbers, and the second function of the decompression function is configured to apply a scalar non-linear function to each of the plurality of numbers. The scalar non-linear function may for example be an activation function. An explicit example implementation of such first and second functions are the functions 1516 and 1518 in the autoencoder example described below with reference to FIG. 15.

According to some embodiments, the first function of the compression function is a linear function, or the first function of the compression function comprises is a linear portion (or linear part) and a constant portion (or a constant part). In other words, in addition to having a linear portion, first function of the compression function may comprise a constant portion which is not affected by input data received by the first function. The constant portion may for example be provided in the form of a constant term or bias.

According to some embodiments, the first function of the decompression function is a linear function, or the first function of the decompression function comprises is a linear portion (or linear part) and a constant portion (or a constant part). In other words, in addition to having a linear portion, first function of the decompression function may comprise a constant portion which is not affected by input data received by the first function. The constant portion may for example be provided in the form of a constant term or bias.

According to some embodiments, the quantizer of the compression function is configured to receive a plurality of numbers (for example from the second function of the compression function), and to apply scalar quantizers to the received numbers. The scalar quantizers may for example be stochastic quantizers, as described below in section 6.2.7.

Figure 17:
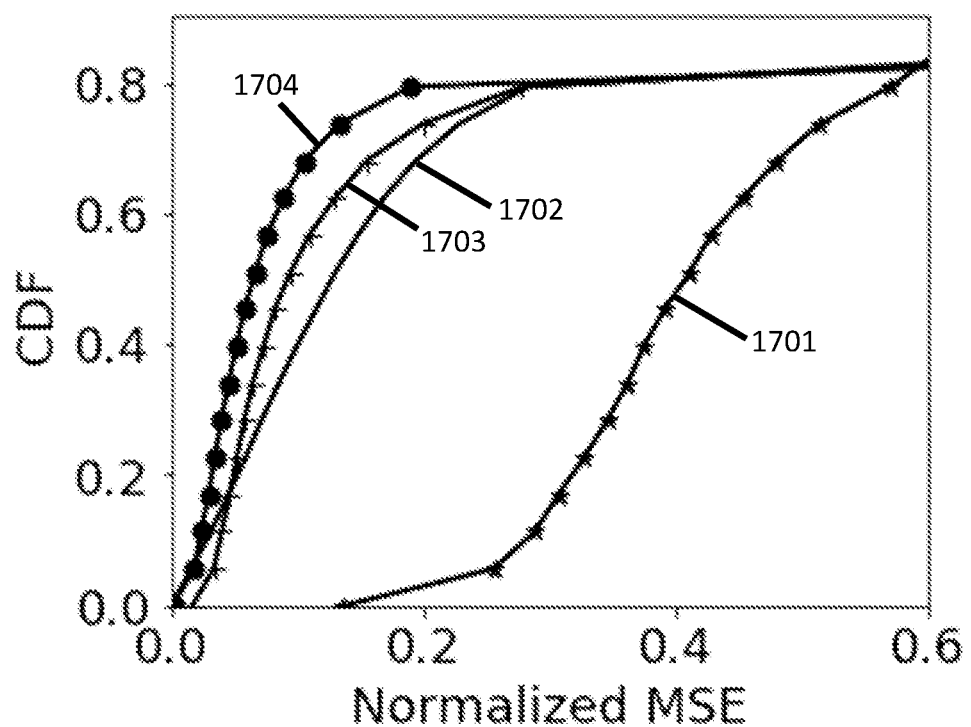
FIG. 17 shows performance of different compression methods.

FIG. 17 shows performance of four different compression methods on a large set of real downlink-channel estimates, which were obtained by a receiver on a car driving around in an area with buildings. In the present example, each channel estimate consists of 120 different values (120 complex numbers). Four different methods were used to compress each downlink-channel estimate from its original 120 values down to 5 values (e.g., for uplink transmission), and then to reconstruct it back to 120 values. The performance of each compression method is characterized by a cumulative distribution function (CDF) of the mean squared error (MSE) of the reconstruction. The CDF curves describe the % of channels that achieve a certain MSE. For example, the solid curve 1703 achieved a MSE of 0.14 or less for 50% of the measured channels. The channels are all normalized to one, so 100% channels achieve an MSE of 1 or less.

The * curve 1701 is the standard compression method using only linear functions (two matrix multiplications W1*W2). Its performance is quite bad.

The + curve 1702 adds a nonlinear function between the matrices W1 and W2 (the nonlinear function is a linear rectifier unit). The compression performance is much better because the nonlinear function allows "bad" linear projections in W1 to be removed and/or repurposed to "good" linear projections that better match the channel estimate.

The solid curve 1703 is the "idea genie aided" scheme in which the terminal device only tells the network node of the five largest values of the channel estimate. Here we assume a "genie" provides the location of these largest values in the channel estimate to be network node for free (so it is not really practical, but it's a good reference point).

The circle curve 1704 is for a more complicated nonlinear function involving a neural network with nonlinear activation functions and many layers of nodes. Its performance is better than for the other compression methods in FIG. 17.

In the example described above with reference to FIG. 17, the parameters of the compression methods (such as the first set of parameters a received at step 302 in the method 300) were trained/designed/optimized only using simulated synthetic downlink channel estimates in a simulator (and not using the real measurements from the car). So the curves in FIG. 17 suggest that nonlinear compression functions and decompression functions can be designed "offline" using synthetic simulator data.

According to some embodiments, the first set of parameters and the decompression function are determined in the method 400 based on:

information about the terminal device 502; and/or
information about the network node 501 and/or
information about a cell of the network node 501.

In other words, the step 401 of determining the first set of parameters, and the step 402 of determining the compression function may be based on any of the above factors. This allows the compression of the downlink channel estimates to be tailored to the specific circumstances, rather than being the same for all network nodes 501, terminal devices 502 and cells in a communication network.

The network node may for example have access to a list (or database) of suitable compression functions (for example defined in the list via respective values for the first set of parameters) and decompression functions (for example defined in the list via respective values for a second set of parameters) to be used in different scenarios. The network node may for example select among the options available in the list based on the above listed factors.

According to some embodiments, the first set of parameters and the decompressor are determined in the method 400 based on:

a position of the network node; and/or
a position of the terminal device; and/or
an expected pathloss for the terminal device; and/or
a precoding method used by the network node; and/or
a type of preceding used to transmit downlink reference signals; and/or
a time and/or frequency granularity of channel state information, CSI, related measurements and reporting.

In other words, the step 401 of determining the first set of parameters, and the step 402 of determining the compression function may be based on any of the above factors. For example, the compression function and the decompression function may be designed differently for codebook-based precoding (e.g., using a Rel 15 downlink MIMO codebook) versus for non-codebook-based precoding (e.g., zero-forcing precoding where the network node tries to invert the channel matrix). Further examples of factors which may be taken into account when making these determinations are provided below in section 6.2.3.

3. Alternating Sequence of Two Types of Functions

In the autoencoder example described below with reference to FIG. 15, the compression function 1501 only has a single part 1508 defined via the first set of parameters a and a single non-linear part 1511 in addition to the quantizer 1513. However, the compression function could comprise an alternating sequence of such parts, corresponding to an artificial neural network with more layers, where weighted sums are formed at the nodes, and where non-linear activation functions are applied to the weighted sums. The weights employed in the weighted sums may be controller via the first set of parameters a.

Figure 6:
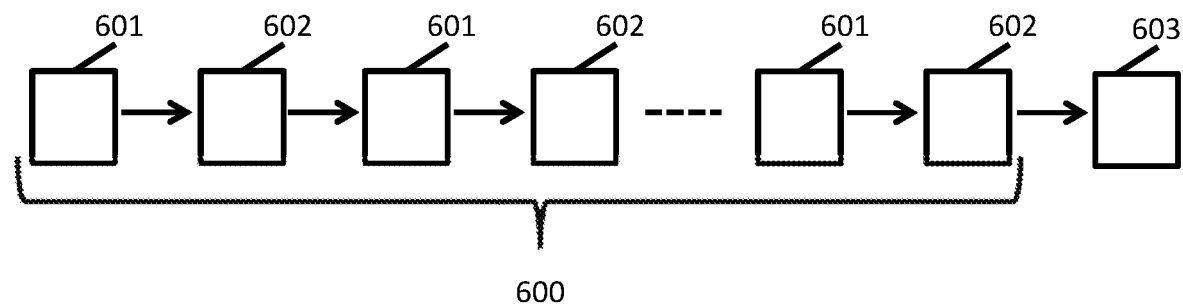
FIG. 6 shows a schematic representation of a compression function, according to an embodiment.

FIG. 6 shows a schematic representation of such a compression function, according to an embodiment. In the present embodiment, the compression function formed at step 303 of the method 300 comprises an alternating sequence 600 of a first type of functions 601 and a second type of functions 602. At least some of the first type of functions 601 are formed based on parameters from the first set of parameters. The second type of functions 602 are non-linear functions. In addition to the alternating sequence 600, the compression function also comprises a quantizer 603.

According to some embodiments, the order of the functions in the alternating sequence 600 of the first type of functions 601 and the second type of functions 602 is predefined. In other words, the order of the functions in the sequence 600 is not affected by the values of the first set of parameters a.

According to some embodiments, the first type of functions 601 are linear functions; or
functions comprising a linear portion and a constant portion.

Figure 15:
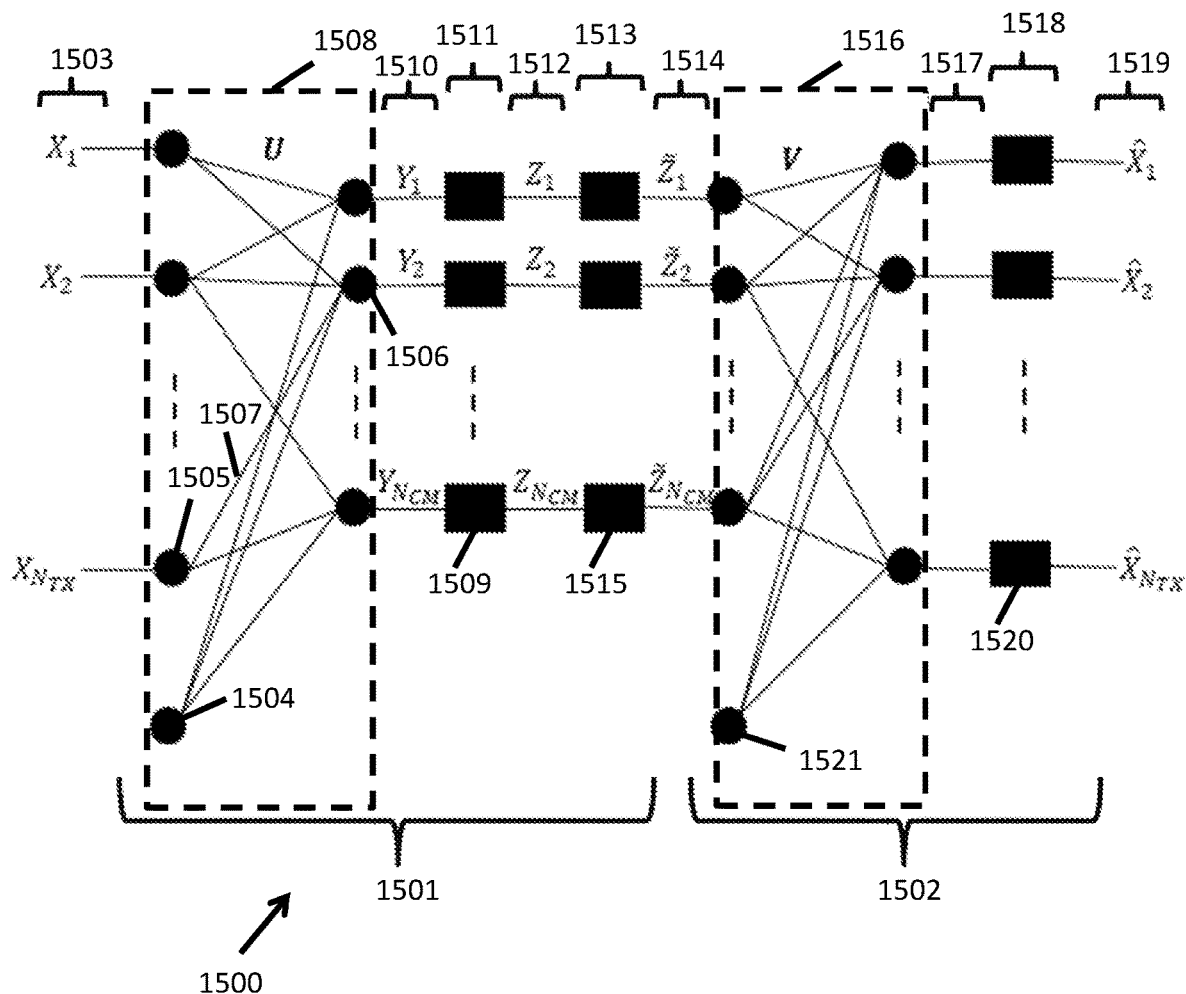
FIG. 15 shows a compression function and a decompression function provided in the form of a neural network, according an embodiment.

In other words, the first type of functions 601 could have a constant portion (or bias portion) in addition to a linear portion, in analogy with the function 1508 in FIG. 15. If there is no constant portion (or bias), the first type of functions 601 are linear functions.

According to some embodiments, the second type of functions 602 are predefined. In other words, the second type of functions 602 are not affected by the values of the first set of parameters a.

Figure 7:
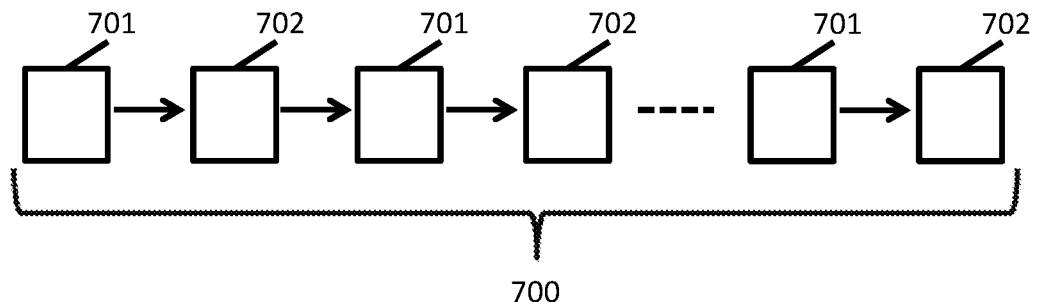
FIG. 7 shows a schematic representation of a decompression function, according to an embodiment.

In analogy with the compression function shown FIG. 6, the decompression function could comprise an alternating sequence of functions of a first type and functions of a second type. FIG. 7 shows a schematic representation of such a decompression function, according to an embodiment. In the present embodiment, the decompression function determined at step 402 comprises an alternating sequence 700 of a first type of functions 701 and a second type of functions 702. The second type of functions 702 are non-linear functions. The step 402 of determining the decompression function comprises determining at least some of the first type of functions 701. In other words, at least some of the first type of functions 701 are not predefined. In contrast to the compression function shown in FIG. 6, the decompression function does not comprise a quantizer.

According to some embodiments, the order of the functions in the alternating sequence 700 of the first type of functions 701 and the second type of functions 702 is predefined.

According to some embodiments, the first type of functions 701 are
linear functions; or
functions comprising a linear portion and a constant portion.

In other words, the first type of functions 701 could have a constant portion (or bias portion) in addition to a linear portion, in analogy with the function 1516 in FIG. 15. If there is no constant portion (or bias), the first type of functions 701 are linear functions.

According to some embodiments, the second type of functions 702 are predefined. In other words, the second type of functions 602 are known in advance by the network node 501.

4. Use of a Second Set of Parameters

Figure 8:
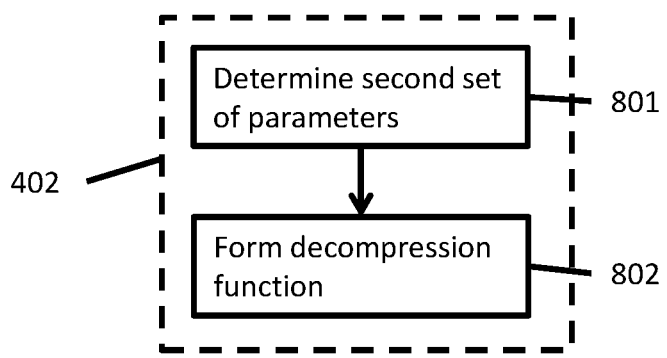
FIG. 8 illustrates an example scheme for determining a decompression function in the method in FIG. 4, according to an embodiment.

FIG. 8 illustrates an example scheme for determining the decompression function in the method 400 described above with reference to FIG. 4, according to an embodiment. In the present embodiment, the step 402 of determining the decompression function comprises determining 801 a second set of parameters, and forming 802 the decompression function based on the second set of parameters. In other words, the second set of parameters are employed (or used) to create or generate the decompression function. It will be appreciated that the second set of parameters comprises multiple parameters. In some examples described below, the second set of parameters is denoted by b.

Figure 9:
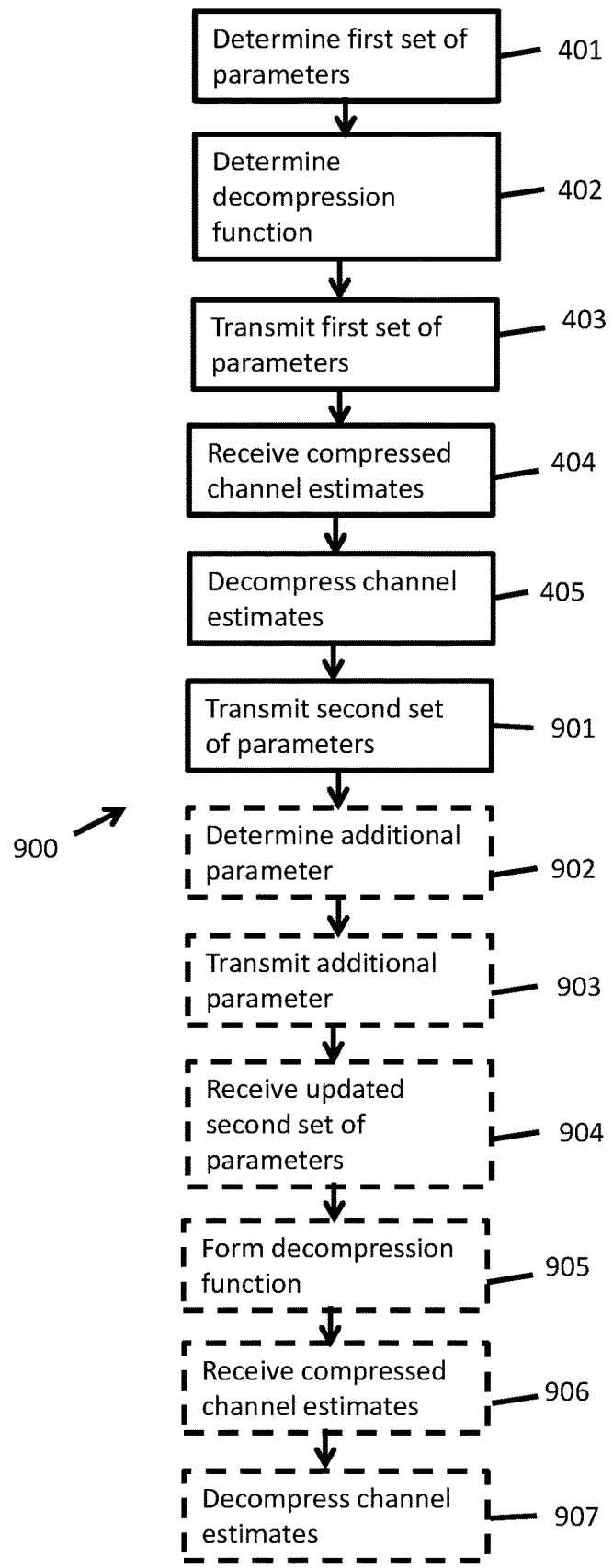
FIG. 9 is a flow chart of a method of operating a network node, including transmission of parameters indicating a decompression function, according to an embodiment.

FIG. 9 is a flow chart of a method 900 of operating a network node, according to an embodiment. The method 900 comprises the steps 401-405 from the method 400 described above with reference to FIG. 4, where the step 402 comprises the steps 801-802 described above with reference to FIG. 8. The description of those steps will not be repeated here. The method 900 further comprises transmitting 901 the second set of parameters. The second set of parameters may be received and employed by a terminal device, as described below with reference to FIG. 10.

Figure 10:
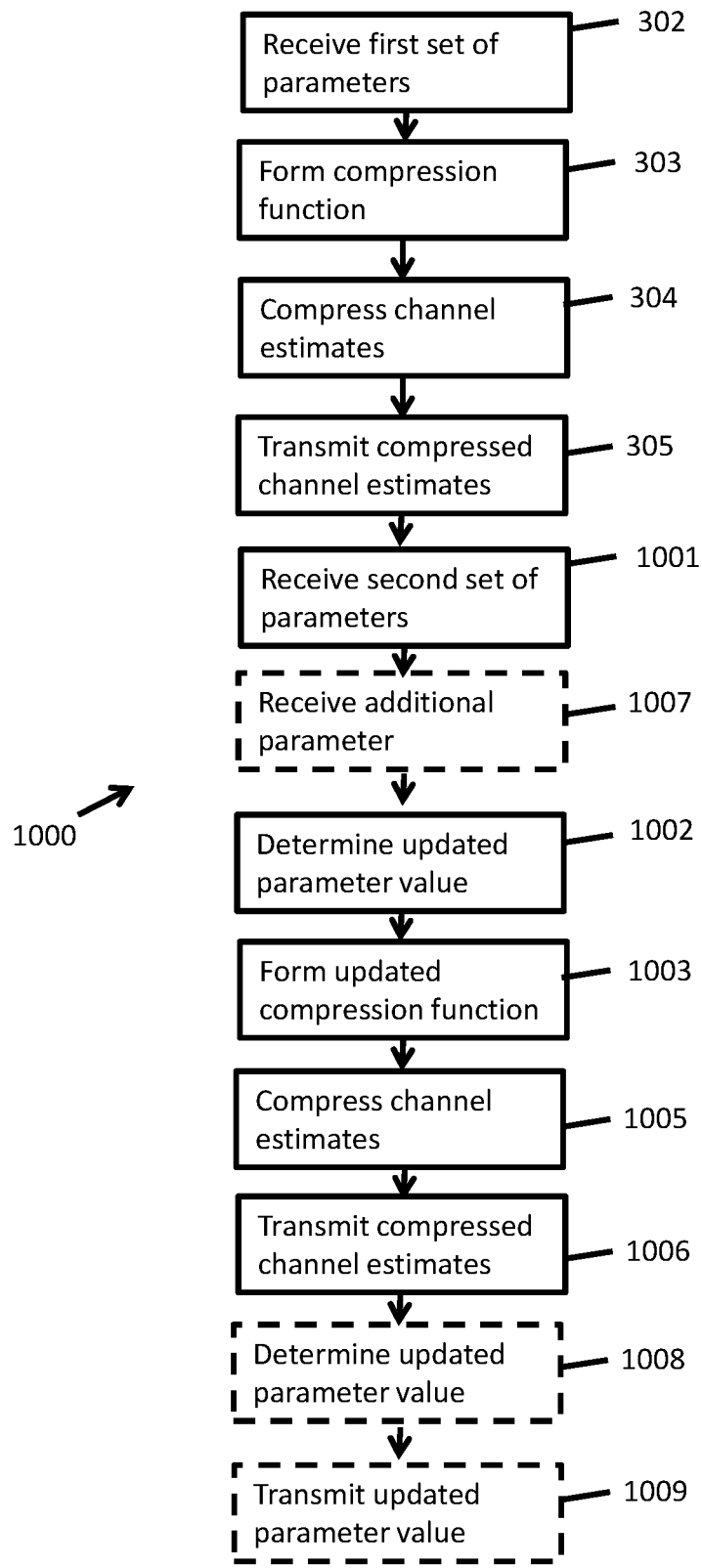
FIG. 10 is a flow chart of a method of operating a terminal device, including determination of an updated compression function, according to an embodiment.

FIG. 10 is a flow chart of a method 1000 of operating a terminal device, according to an embodiment. The method 1000 comprises the steps 302-305 from the method 300 described above with reference to FIG. 3. The description of those steps will not be repeated here. The method 1000 further comprises receiving 1001 a second set of parameters. The second set of parameters indicates a decompression function for decompressing downlink channel estimates which have been compressed using the compression function. The second set of parameters is the same set of parameters as the second set of parameters transmitted at step 1201 in the method 900.

The method 1000 comprises determining 1002, based on the first set of parameters and the second set of parameters, an updated value for at least one parameter from the first set of parameters, and forming 1004 an updated compression function based on the updated value. The terminal device may for example detect or determine that the compression function indicated via the first set of parameters is not optimal in combination with the decompression function indicated via the second set of parameters. Performance of the compression function and the decompression function may for example be evaluated as described below in section 6.2.2. The terminal device may determine of compute updated values for one of more of the first set of parameters, so as to obtain a more suitable compression function.

The method 1000 comprises compressing 1005 downlink channel estimates using the updated compression function, and transmitting 1006 the downlink channel estimates compressed using the updated compression function. In other words, the terminal device may employ the new compression function instead of the compression function formed at step 303.

Figure 11:
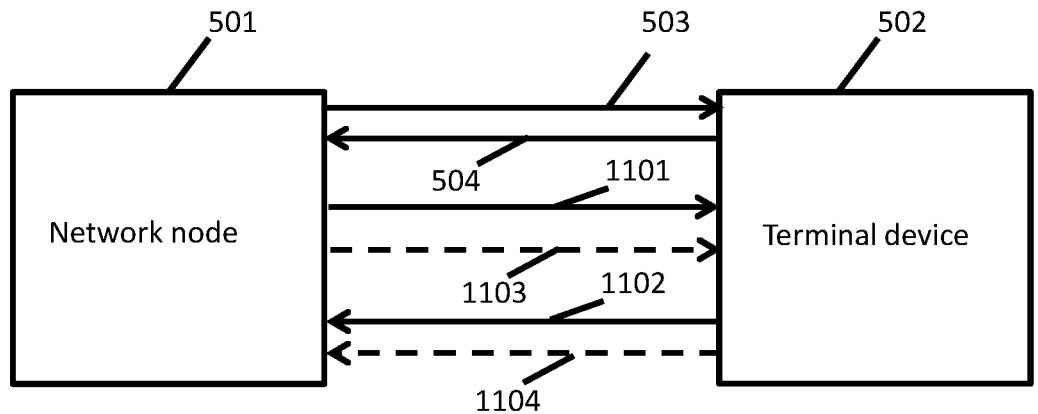
FIG. 11 shows signals transmitted between a network node and a terminal device, including transmission of parameters indicating a decompression function, according to an embodiment.

FIG. 11 shows that the second set of parameters 1101 may be transmitted 901 from the network node 501 to the terminal device 502, and that the new compressed downlink channel estimates 1102 (in other words, those which were compressed 1005 using the new compression function) may be transmitted 1006 from the terminal device 502 to the network node 501.

The methods 900 and 1000 in FIGS. 9 and 10 include several optional steps. These optional steps will be described also with reference to FIG. 11, which shows signals which may be transmitted between the network node 501 and the terminal device 502 if such optional steps are employed.

According to an embodiment, the method 900 comprises transmitting 903 a third set of one or more parameters 1103. The third set of one or more parameters 1103 indicates an objective function for evaluating performance of the compression function. In this scenario, the method 1000 comprises receiving 1007 the third set of one or more parameters 1103. In the present embodiment, the updated value for at least one parameter from the first set of parameters is determined at step 1002 using the objective function. In some examples described below, the third set of one or more parameters is denoted by d.

The objective function may for example be a cost function or a loss function for evaluating whether downlink channel estimates after compression and decompression are similar to the original downlink channel estimates, as described below in section 6.2.2. If the deviation between the reconstructed values and the original values is too large, it may be a good idea to update the compression function and/or the decompression function. While cost functions may be employed to define an optimization problem in which the cost function is to be minimized, it will be appreciated that such an optimization problem may easily be reformulated into an equivalent optimization where an objective function equal to the cost function multiplied by −1 is to be maximized. In other words, the objective function need not necessarily be a cost function which is to be minimized.

The method 900 may for example comprise the step 902 of determining the third set of one or more parameters 1103. The third set of one or more parameters 1103 (and thereby also the objective function) may for example be determined based on information about the network node, and/or the terminal device. The third set of one or more parameters 1103 (and thereby also the objective function) may for example be determined based on a precoder employed by the network node, as described below in section 6.2.2.

According to some embodiments, the method 1000 comprises determining 1008, based on the first set of parameters and the second set of parameters, an updated value for at least one parameter from the second set of parameters, and transmitting 1009 the updated value for at least one parameter from the second set of parameters. In the present scenario, the method 900 comprises receiving 904 the updated value for at least one parameter from the second set of parameters and forming 905 a second decompression function based on the updated value. In other words, the updated value is employed to generate a new decompression function. Hence, the terminal device 502 indicates via the updated value that the network node 502 should use a different decompression function. The terminal device 502 may for example have detected that both the compression function and the decompression function should be changed to improve performance. FIG. 11 shows that the updated value 1104 for at least one parameter from the second set of parameters may be transmitted 1009 from the terminal device 502 to the network node 501.

The method 900 may for example comprise receiving 906 second compressed downlink channel estimates 1102, and decompressing 907 the second compressed downlink channel estimates using the second decompression function formed at step 905. The transmission of the second compressed downlink channel estimates 1102 is illustrated in FIG. 11.

5. Evaluation of Performance at the Network Node

Figure 12:
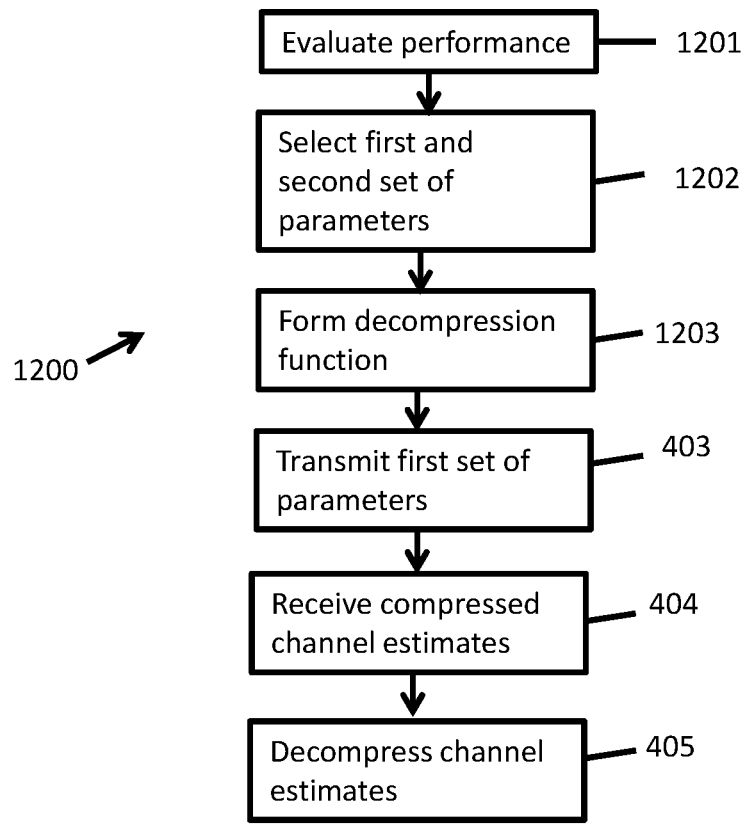
FIG. 12 is a flow chart a method of operating a network node, including selection of parameters based on evaluation of compression functions and decompression functions, according to an embodiment.

FIG. 12 is a flow chart a method 1200 of operating a network node according to an embodiment. The method 1200 is similar to the method 400 described above with reference to FIG. 4, except that the steps of determining 401 the first set of parameters and determining 402 the decompression function are expressed in terms of three new steps 1201-1203. More specifically, the method 1200 comprises evaluating 1201 performance of different compression functions and decompression functions using an objective function, selecting 1202 values for the first set of parameters and the second set of parameters based on the evaluation, and forming 1203 the decompression function based on the second set of parameters. In other words, values for the first set of parameters and the second set of parameters are determined via evaluation 1201 of different candidate compression functions and candidate decompression functions. A suitable compression function and a suitable decompression function may for example be determined via the evaluation, and the values for the first and second sets of parameters may for example be selected to indicate the suitable compression function and the suitable decompression function, respectively. The evaluation may for example be performed as described below in section 6.2.2.

Figure 13:
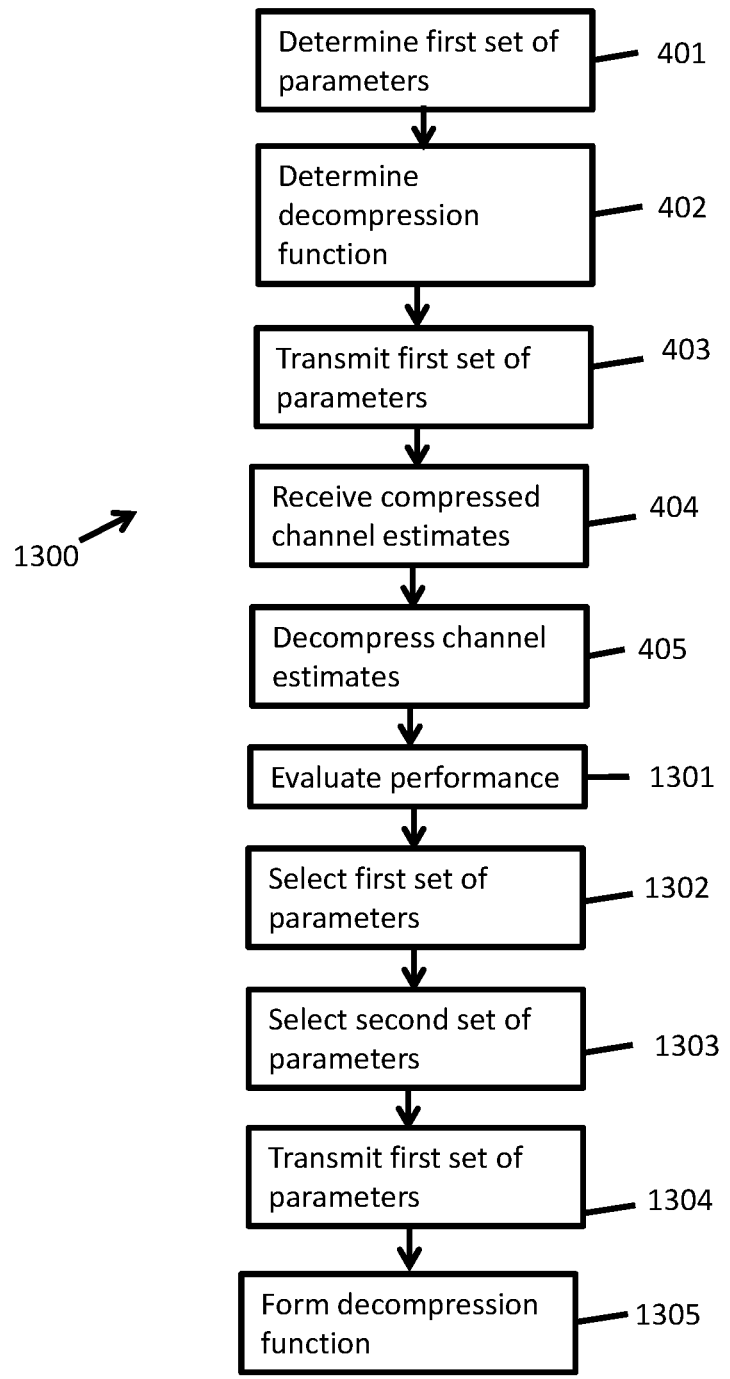
FIG. 13 is a flow chart a method of operating a network node, including updating of parameters based on evaluation of a compression function and a decompression function, according to an embodiment.

FIG. 13 is a flow chart a method 1300 of operating a network node, according to an embodiment. The method 1300 comprises the steps 401-405 from the method 400 described above with reference to FIG. 4. The description of these steps will not be repeated here.

The method 1300 comprises evaluating 1301 performance of the compression function (indicated by the first set of parameters determined at step 401) and the decompression function (determined at step 402) using an objective function. The objective function may for example be a cost function of a loss function. The evaluation may for example be performed as described below in section 6.2.2.

The method 1300 comprises selecting 1302 a first updated value for at least one parameter from the first set of parameters based on the evaluation, selecting 1303 a second updated value for at least one parameter from the second set of parameters based on the evaluation, transmitting 1304 the first updated value, and forming 1305 an updated decompression function based on the second updated value. In other words, the first updated value is transmitted 1304 for informing a terminal device that a new compression function is to be employed for compression of downlink channel estimates. An updated decompression function is formed 1305 based on the second updated value so that downlink channel estimates which have been compressed using the new compression function can be decompressed in an appropriate way.

Figure 14:
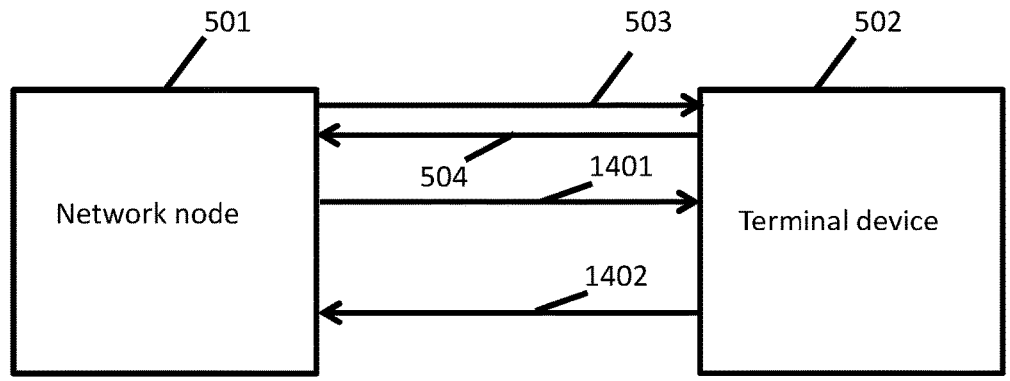
FIG. 14 shows signals transmitted between a network node and a terminal device, including transmission of an updated parameter from the terminal device, according to an embodiment.

FIG. 14 shows signals which may be transmitted between the network node 501 and the terminal device 502 when the method 1300 is performed. The first updated value 1401 is transmitted 1304 from the network node 501 to the terminal device 502. The first updated value 1501 is employed by the terminal device 502 to form a new compression function. The terminal device 502 then employs the new compression function to compress downlink channel estimates, and the compressed downlink channel estimates 1542 are transmitted from the terminal device 502 to the network node 501.

According to some embodiments, the evaluation performed at step 1201 of the method 1200 or the evaluation performed at step 1301 may be performed using a neural network.

6. Example Implementation 6.1 Overview

A new channel state compression (CSC) framework is proposed that enables the BS (provided herein as an example of a network node) to learn and exploit the unique channel statistics exhibited by UEs (provided herein as examples of terminal devices) in its cell. The CSC framework can be incorporated within 3GPP's CSI reporting framework (Rel. 15) with few changes.

The proposed CSC framework includes the following three sets:
 a configurable CS compressor comprising an alternating sequence of linear- and non-linear operators (the CS compressor is a finite-rate compressor in the sense that it compresses channel state estimates into a format that can be conveyed using a finite number of bits),
 a configurable CS decompressor comprising an alternating sequence of linear- and non-linear operators, and
 a cost function.

An example of how the CSC framework can be used in a 3GPP network is as follows:
 1. When a new UE joins a cell, the serving BS associates the UE with the following objects:
  a. A configurable CS compressor (also referred to as a compression function): The UE uses the CS compressor to compress its raw CSI (for example, channel and/or interference plus noise covariance matrix estimates) for transmission to the BS over the uplink. In some embodiments, the CS compressor is used by BS and/or UE for model-training purposes.
  b. A configurable CS decompressor (also referred to as a decompression function): The BS uses the CS decompressor to reconstruct the UE's compressed CSI. In some embodiments, the CS decompressor is used by BS and/or UE for model-training purposes.
  c. A cost function (also referred to as an objective function): The UE and BS can use the cost function in different ways (for the different example embodiments described below) to evaluate and train the compressor and decompressor.
 2. During the cell-association procedure, the BS may configure and signal a specific CS configuration to the UE using one of the following methods:

a. Explicitly: For example, the BS can signal to the UE a specific compressor and decompressor configuration along with a desired cost function using the radio resource control (RRC), as part of the CSI reporting settings (3GPP TS 38.214 V15.4.0). This capability enables the gNB to learn and exploit unique statistical characteristics of its environment and the UE type for compression. Different example embodiments of the learning procedure are presented below.

b. Implicitly: For example, the BS and UE may assume a default cost function and/or a default configuration for the CS compressor and CS decompressor until a new configuration is determined. These default settings can be tailored to match general propagation properties of the deployment, and specific characteristics of the BS and UE that can be determined from other means (for example, the UE category).

3. While connected to the BS, the BS and/or UE can evaluate the compression performance and, if needed, train and update the configuration of the CS compressor and decompressor. Different update methods (e.g., periodic, aperiodic) as well as training modes (e.g., gNB-side, UE-side, centralized, and de-centralized) are outlined below.

6.2 Example Embodiment 1

6.2.1 Channel State Compression (CSC)

The 3GPP standard can be modified to define a class of channel state compression (CSC) encoders, $\{f_a\}_{a \in \mathbb{A}}$, a matching class of CSC decoders $\{g_b\}_{b \in \mathbb{B}}$, and a class of cost functions $\{\Delta_d\}_{d \in \mathbb{D}}$.

The CSC encoders can be used by the UEs to compress their raw "explicit" channel matrices or tx-channel covariance matrices for transmission over the uplink.

The CSC decoders can be used by the BSs to decompress the UEs' channel estimates.

The cost functions can be used by the BS and/or UEs to measure the performance of a given compressor-decompressor pair.

The encoder and decoder functions respectively take the forms $$f_a: \mathbb{C}^N \to \{1, 2, \ldots, M\}$$

and $$g_b: \{1, 2, \ldots, M\} \to \mathbb{C}^N$$

for some non-negative integers N and M.

The integer N implicitly defines how many complex channel coefficients (or, covariance matrix coefficients) are jointly compressed at the UE. For example, if we jointly compress the UE's channel estimates over the 9 subbands over the frequency domain, then $N=N_{TX}N_{RX}N_{SB}=64 \times 4 \times 9 = 2304$.

The integer M defines how many bits (i.e., $[\log_2(M)]$) are fed back over the uplink.

The subscripts $a \in \mathbb{A}$ and $b \in \mathbb{B}$ represent parameters that define the encoder $f_a$ and decoder $g_b$ respectively (and, therefore, the integers N and M). a is a first set of parameters, and b is a second set of parameters. d is a set of one or more parameters.

The sets $\mathbb{A}$, $\mathbb{B}$ and $\mathbb{D}$ represent finite sets from which the parameters a, b and d can $\mathbb{A}$ be selected respectively.

6.2.2 Performance Evaluation of CSC

Consider a compressor-decompressor-cost function tuple $(f_a, g_b, \Delta_d)$ for some $a \in \mathbb{A}$, $b \in \mathbb{B}$ and $d \in \mathbb{D}$. Let $(c_1, c_2, \ldots, c_N) \in \mathbb{C}^N$ denote N downlink channel coefficient estimates to be compressed and fed back to the BS over the uplink. For example, these coefficients can be the coefficients of one or more subcarrier (or, resource block) channel matrices spanning the whole band or a subband. Let $$(\hat{c}_1, \hat{c}_2, \ldots, \hat{c}_N) := g_b(f_a(c_1, c_2, \ldots, c_N))$$

denote the BS's reconstruction of these measurements using $(f_a, g_b)$. The instantaneous performance of $(f_a, g_b)$ on $(c_1, c_2, \ldots, c_N)$ can be quantified by the compression rate (measured in average number of bits per channel coefficient)

$$R := \frac{1}{N} \log_2 M$$

and a reconstruction cost $$\Delta_d: (\hat{c}_1, \hat{c}_2, \ldots, \hat{c}_N), (c_1, c_2, \ldots, c_N)) \mapsto [0, \infty].$$

Different embodiments of the proposed CSC framework employ different cost functions. For example, basic candidate cost functions are the average square error distortions $$\Delta_d((\hat{c}_1, \hat{c}_2, \ldots, \hat{c}_N), (c_1, c_2, \ldots, c_N)) = \frac{1}{N} \sum_{n=1}^{N} (\hat{c}_n - c_n)^2.$$

Or the average normalized square error distortions $$\Delta_d((\hat{c}_1, \hat{c}_2, \ldots, \hat{c}_N), (c_1, c_2, \ldots, c_N)) = \frac{1}{N} \sum_{n=1}^{N} \frac{(\hat{c}_n - c_n)^2}{|c_n|}$$

These cost functions are not ideal for MIMO precoding because they enforce the reconstructions to be accurate in channel dimensions that are not important for beamforming. More generally, it is important to carefully choose the cost function to match the BS's intended usage of the CSI feedback. For example, if it is known that the BS will employ a zero-forcing precoder to suppress inter-layer interference in MU-MIMO, then it would be appropriate to choose a suitable $\Delta_d$ to quantify the cost of choosing the wrong zero-forcing precoder (e.g., this could be a "throughput cost" with respect to zero-forcing precoding on the ideal channel).

In an example scenario, BS uses the uplink CSI to choose a downlink MIMO precoder. A MIMO precoder is a matrix P that depends on the downlink-channel estimate H. An important MIMO precoding method aims to choose P to be a pseudo inverse of H, in other words to choose P such that HP=a diagonal matrix. The cost function employed in our proposed compression approach could then be the MSE of reconstructing a "P" such that HP=diagonal, instead of the MSE of the original channel matrix H. The cost function could also add additional punishment to reconstructed P matrices that don't satisfy HP=diagonal (since off-diagonal elements cause inter-layer interference and, therefore, lower throughput to the UE).

In another example scenario, the MIMO precoder P is chosen from a codebook of precoders. In such cases the cost function employed in our proposed compression approach could then be designed to punish "wrong" choices from the codebook, rather than the MSE of H.

The compression rate can be derived directly from the encoder $f_a$. Different embodiments can consider different knowledge of the compressor, decompressor, and cost function at the BS and UE. For example, the following embodiments are possible:

$f_a$, $g_b$ and $\Delta_d$ are known to both the BS and UE, or
$f_a$, $g_b$ and $\Delta_d$ are known to the BS, and $f_a$ is known to the UE.

6.2.3 Cell Association (Initialization of CSI Compressors)

When a new UE joins a cell, the serving BS may configure the UE CSI reporting settings as part of the RRC (see Section 5.2 in 3GPP TS 38.214 V15.4.0). During this CSI configuration step, the BS can signal to the UE CSC parameters (a*, b*) and a cost function $\Delta_d$. Different embodiments for this cell-association step are presented below.

The CSC parameters (a*, b*) can be tailored by the BS to, for example, match important attributes of the UE and the cell. For example, the parameters (a*, b*) can be tailored by the BS to match important factors in the propagation environment. Such factors can include, for example, the following examples.

Cell-specific: For example, (a*, b*) can be chosen specifically for the cell's propagation environment, considering, for example, the carrier and numerology; the BS's antenna configuration (panel and antenna layout); the spatial distribution of UEs; and the multipath characteristics of the channel.

UE-specific: For example, (a*, b*) can be chosen specifically to exploit properties of the UE's antenna array (e.g., antenna coherence, spacing and layout); and the computational abilities of the UE. For example, a specific parameter set can be specified for a given UE model.

Pathloss & precoding specific: (a*, b*) can be chosen specifically to the UE's pathloss and expected rank. For example, a UE located at the cell-edge will experience a large pathloss and will likely only be scheduled with low rank in a SU-MIMO manner. The parameters (a*, b*) can be tailored to match the rank and expected codebook-based precoding mode.

CSI-RS-specific: For example, (a*, b*) can be designed specifically to exploit the type of precoding used to transmit the downlink reference signals (for example, beamformed CSI-RS from non-coherent antenna ports or panels versus beamformed CSI-RS from coherent antenna ports).

Time and/or frequency granularity of CSI-related measurements and reporting: For example, (a*, b*) can be designed and chosen to match the reporting frequency granularity of the CSI reports.

The parameters (a*, b*) can be preconfigured by the vendor or network operator based on, for example, laboratory experiments and/or field trials with the BS equipment and UE equipment.

The parameters (a*, b*) can also be learned (or, periodically updated) by the BS using a supervised-learning or reinforcement-learning process that exploits, for example, historical (or live or synthetic) channel measurements made elsewhere or within the BS's own cell. Such measurements can contain raw complex channel coefficient measurements, pathloss measurements, channel-correlation measurements, information on the spatial distribution of users, multipath statistics, etc. Different embodiments of such learning processes are given below. Two key points:

The BS can use any information at its disposal to choose/design (a*, b*),

The UE can use the cost function to collect statistics on the compression performance to report back to the BS.

6.2.4 CSI Report Configuration

As described in 3GPP TS 38.214 V15.4.0 the UE is configured by higher layers with N≥1 ReportConfig reporting settings, M≥1 ResourceConfig resource settings, and a single MeasConfig measurement setting containing L≥1 Links.

"Each Reporting Setting ReportConfig is associated with a single downlink BWP (higher layer parameter bandwidth-PartId) and contains the reported parameter(s) for one CSI reporting band: CSI Type (I or II) if reported, codebook configuration including codebook subset restriction, time-domain behavior, frequency granularity for CQI and PMI, measurement restriction configurations, the strongest layer indicator (SLI), the reported L1-RSRP parameter(s), CRI, and SSBRI (SSB Resource Indicator). Each ReportConfig contains a ReportConfigID to identify the ReportConfig, a ReportConfigType to specify the time domain behavior of the report (either aperiodic, semi-persistent, or periodic), a ReportQuantity to indicate the CSI-related or L1-RSRP-related quantities to report, a ReportFreqConfiguration to indicate the reporting granularity in the frequency domain". (3GPP TS 38.214 V15.4.0)

To enable the proposed CSC framework, the CSI Report-Config can be modified to include:

an advanced CSI Type II with "compressed explicit channel matrix feedback", and/or an advanced CSI Type II with "compressed explicit tx-covariance matrix feedback", in which the UE reports the compressed channel estimates $f_a(c_1, c_2, \ldots, c_N)$ using PUCCH and/or PUSCH.

If configured for Type-I or Type-II CSI feedback, the ReportConfig contains a CodebookConfig that specifies configuration parameters for Type-1 and Type-II CSI feedback. To enable the proposed CSC framework, the CodebookConfig can be modified to specify the encoding and decoding parameters (a*, b*).

Each ReportConfig contains a ReportFreqConfig:

"ReportFreqConfiguration to indicate the reporting granularity in the frequency domain. For periodic/semi-persistent reporting, a ReportConfig contains a ReportSlotConfig to specify the periodicity and slot offset. For aperiodic reporting, a ReportConfig contains an AperiodicReportSlotOffset to specify a set of allowed values of the timing offset for aperiodic reporting (a particular value is indicated in DCI). The ReportFreqConfiguration contains parameters to enable configuration of at least subband or wideband PMI and CQI reporting separately. The ReportConfig can also contain MeasRestrictionConfig-time-channel to specify parameters to enable configuration of time domain measurement restriction for channel. The ReportConfig can also contain MeasRestrictionConfig-time-interference to specify parameters to enable separate configuration of time domain measurement restriction for interference."

As mentioned above, the encoding and decoding parameters (a*, b*) can be tailored specifically to match the reporting variables in the ReportFreqConfig.

6.2.5 Updating CSC Parameters

During the cell-association step, a CSC update type can be configured (e.g., as part of the ReportFreqConfig) to determine how CSC parameters (a*, b*) can be updated (if at all) during the UE's connection time to the BS's cell. Example CSC update types:

Static: The UE and BS can assume that no update of the decoding parameters b* will take place. The UE can choose to update one-or-more of the encoding parameters a* at any time, assuming such an update is transparent to the BS. As the UE can evaluate the decoding performance if the decoding parameters b* are known, it may autonomously update the encoding parameters a* such that it minimizes the reconstruction error $\Delta_d$ of the raw channel estimates to be conveyed in each CSI report.

BS-initiated CSC parameter updates: The BS can configure the UE (e.g., during the above CSI configuration step) to accept updates to one-or-more CSC parameters. The time-domain behavior of these updates can be configured to be periodic or aperiodic.

UE-initiated CSC parameter updates: The BS can configure the UE to recommend updates to one-or-more of CSC parameters. The time-domain behavior of these updates can be configured to be periodic or aperiodic.

Explicit channel estimate updates: The BS can configure the UE to send raw uplink channel estimate updates from which the BS can update the CSC parameters. The time-domain behavior of these updates can be configured to be periodic or aperiodic. Note: As discussed in the background section, transmitting raw channel estimates in the CSI feedback report is an expensive process and should be done infrequently.

6.2.6 CS Compressors and Decompressors Based on an Autoencoder Framework

FIG. 15 shows a compression function 1501 and a decompression function 1502 provided in the form of a neural network 1500, according an embodiment. In the present embodiment, compression and decompression is based on an autoencoder framework.

For simplicity, consider a BS (provided here as an example of a network node) with $N_{TX}$ antenna ports and a UE (provided here as an example of a terminal device) with a single antenna port. Suppose that the UE joins the cell of the BS, and that the BS configures the UE with a first set of parameters a* and a second set of parameters b*.

The class of encoders $\{f_a\}_{a \in \mathbb{A}}$ (which act as compression functions) and the decoders $\{g_b\}_{b \in \mathbb{B}}$ (which act as decompression functions) can be defined by the autoencoder structure in FIG. 15.

Let $X=[X_1, X_2, \ldots, X_{N_{TX}}]^T$ denote the $N_{TX}$ downlink channel estimates 1503 in one frequency interval (e.g., one channel estimate is derived from each configured CSI-RS resource). The first part of the encoder $f_a$ (in other words, the compression function 1501) involves a dimensionality reduction step in which the $N_{TX}$ complex-valued channel measurements $X=[X_1, X_2, \ldots, X_{N_{TX}}]^T$ are mapped to $N_{CM}$ complex-valued compressed measurements $Z_1, Z_2, \ldots, Z_{N_{CM}}$. More formally, we have $$Z=\sigma(UX+B)$$

where $X=[X_1, X_2, \ldots, X_{N_{TX}}]^T$ represents the ($N_{TX}\times 1$) vector of complex CSI-RS measurements taken by the UE. That is, $X\ell$ denotes the UE's estimate 1503 of the $\ell$th CSI-RS resource on its antenna port. Alternatively, one can make X a ($2N_{TX}\times 1$) vector of real-valued CSI-RS measurements by splitting each complex measurement into its real and imaginary parts.

$B=[B_1, B_2, \ldots, B_{N_{CM}}]^T$ denotes the $N_{CM}$ biases (equivalently represented by the input node 1504 in FIG. 15).

U is an ($N_{CM}\times N_{TX}$)-complex matrix used by the UE, where $N_{CM}$ represents the number of complex values produced by the UE when applying the transformation UX+B (this is hence the dimension of the compressed CSI) where $N_{CM}<N_{TX}$ meaning that U will constitute a dimension reduction. The elements of U and the biases B can be specified by a first set of parameters a* configured by the BS. For example, the first set of parameters (which corresponds to encoder parameters) can be a*:={$u_{11}, u_{12}, \ldots, u_{N_{CM}N_{TX}}, b_1, b_2, \ldots, b_{N_{CM}}$} where $u_{ij}$ denotes the (i,j)-th element of U and $b_i$ denotes the i-th bias term. The matrix U is represented by the input nodes 1505, the hidden nodes 1506 and the paths 1507 between the nodes. The transformation UX may be regarded as a linear part 1508 of the compressor 1501. In other words, the compressor 1501 comprises a first function UX+B which has a linear portion UX and a constant portion B.

A non-linear activation function $\sigma: \mathbb{C} \rightarrow \mathbb{C}$ (indicated by 1509 in FIG. 15) is applied to each element 1510 of the ($N_{CM}\times 1$)-complex matrix Y=UX+B. Such use of the activation function constitutes a non-linear part 1511 or subfunction of the compression function 1501. The ($N_{CM}\times 1$)-complex output Z (indicated by 1512 in FIG. 15) of this non-linear subfunction 1511 is then quantized 1513 to generate the quantized compressed measurement 1514 that is sent to the BS over the uplink represented by a finite set of bits. The activation function $\sigma$ is a non-linear activation function, such as sigmoid or ReLu. In this embodiment, we assume that the sigmoid activation function is used on the real and imaginary components of each element of Y. The scalar non-linear activation function 1509 is applied to element by element the output 1510 of the linear part 1508. The non-linear activation function 1509 can turn on/off different elements in the output from linear part 1508 to achieve better compression performance.

After the dimensionality-reduction step, the $N_{CM}$ complex-valued measurements Z are quantized 1513 to finite-discrete values $\tilde{Z}$ for transmission over the uplink. The quantization 1513 may include a scalar or vector quantizer. For example, a scalar quantizer 1515 may be applied to each element of Z.

The embodiment in FIG. 15 uses $N_{CM}$ stochastic scalar quantizers 1515 (one for each hidden node 1506), where each stochastic scalar quantizer 1515 consists of L levels (here, for example, we have $M=L^{N_{CM}}$). An embodiment and motivation for using "stochastic" scalar quantizers is explained below. Of course, other embodiments could use standard scalar and/or vector quantization methods together with entropy coding.

The decoder (in other words, the decompression function 1502) can be implemented in a manner like the encoder (in other words, the compression function 1501): The quantized message $\tilde{Z}$ is transmitted to the BS. The BS multiplies $\tilde{Z}$ by an ($N_{CM}\times N_{TX}$)-complex matrix V (this corresponds to a linear part 1516 or subfunction of the decompression function 1502), and then passes the result 1517 through a non-linear part 1518 or subfunction of the decompression function 1502 to obtain the decompressed/reconstructed channel estimates 1519. The non-linear part 1518 involves application of a non-linear activation function $\rho: \mathbb{C} \rightarrow \mathbb{C}$ (indicated by 1520 in FIG. 15) to the respective outputs 1517 of the linear part 1516. The activation function 1520 employed in the decompression function 1502 may for example be the same activation function 1509 as employed in the compression function 1501, but it could also be a different activation function. As in the compression function 1501, biases may be applied via use of a bias node 1521. Due to the bias node 1521, the part 1516 of the decompression function 1502 comprises a linear portion (forming linear combinations of the quantized components of the message $\tilde{Z}$) and a constant portion (provided by the bias node 1521). The elements of V and the output biases 1521 are specified by a second set of parameters b*.

The activation functions 1509 and 1520 at the encoder 1501 and decoder 1502 as well as the stochastic scalar quantizer 1515 are all fixed in this embodiment.

6.2.7 Stochastic Scalar Quantization

The stochastic scalar quantization used in FIG. 15 can be defined as follows. This embodiment applies the stochastic scalar quantizer 1515 to the output of a sigmoid function 1509. The range of the sigmoid is the unit interval [0,1], and we have assumed L quantization levels. We divide the unit interval into L equal subintervals $$\left[\frac{\ell-1}{L}, \frac{\ell}{L}\right], \ell = 1, 2, \ldots, L.$$

Let $z \in [0,1]$ denote the output of a sigmoid function. If z falls within the first or last interval, then the quantizer outputs 1 or L respectively. Otherwise, if $$z \in \left[\frac{\ell-1}{L}, \frac{\ell}{L}\right]$$

For some $\ell \in \{2, 3, \ldots, L-1\}$ then the quantizer outputs:

($\ell-1$) with probability $(z-\ell+1)L$ and $\ell$ with probability $(\ell-z)L$.

This stochastic quantizer can be viewed as a type of regularization.

6.2.8 CSC Parameter Space

The encoder parameter space $\mathbb{A}$ and the decoder space $\mathbb{B}$ collectively define the set of all (allowable) encoder weights, encoder biases, decoder weights, and decoder biases.

6.2.9 Initial CSC Parameters

The CSC parameters a* and b* are determined by the BS and uniquely specify the initial encoder/decoder weights and biases from the parameter spaces $\mathbb{A}$ and $\mathbb{B}$. For example, the initial CSC parameters a* and b* can be designed and updated by the BS in an offline manner using supervised-learning techniques and historical channel data.

6.2.10 Updating CSC Parameters

The encoder/decoder weights and encoder/decoder biases can be updated as described in Section 6.2.5 above.

The UEs' channel measurements without normalization can differ by several orders of magnitude (in linear scale). To partially combat this dramatic variation, we have normalized the CSI-RS measurements by the corresponding (wideband) L1-RSRP. The L1-RSRP is measured by the UE for each CSI report and may in some embodiments be reported to the BS. Thus, the normalized values can be used for both training the autoencoder-based CSC and during live operation.

Normalizing the CSI-RS measurements allows, for example, the resulting trained autoencoder-based CSC to be used for several different UEs with different pathlosses. Without normalization, one would have to perform specific training for many feasible pathlosses, which might not be practical.

It is well documented in the machine-learning literature that gradient-decent based backpropagation algorithms require normalized training data. Using RSRP in the above way will help such algorithms converge.

As described above, the autoencoder-base CSC can be trained using gradient-decent type algorithms with back-propagation. In such algorithms, the derivative of any scalar (or, vector) quantizer must be undefined at some point. In such embodiments, we can use the gradient of the expectation of the stochastic scalar quantizer, which is continuous.

6.3 Further Example Embodiments

The following example embodiments may be envisaged in addition to example embodiment 1 described above in section 5.7.

Embodiment 2: Consider the system described above in example embodiment 1. The autoencoder illustrated in FIG. 15 can be replaced by any other function whose parameters can be trained using historical data and a fixed cost function. For example, a (deep) convolutional neural network, an LSTM network, a neural Turing machine, or a perceptron, can all be used.

Embodiment 3: Consider the system described in example embodiment 1. The input channel estimates $X=[X_1, X_2, \ldots, X_{N_{TX}}]^T$ can be normalized by the corresponding L1-RSRP. The motivation for such a normalization could be to simplify the training of the CSC encoder and decoder. Since the L1-RSRP is known to both the BS and UE, the channel estimates can be normalized and denormalized before and after compression.

Embodiment 4: Consider the system described in example embodiment 1. The input channel estimates $X=[X_1, X_2, \ldots, X_{N_{TX}}]^T$ can remain unnormalized, and additional "L1-RSRP" input(s) are provided to the CSC. For example, the CSC encoder parameters a include the L1-RSRP.

Embodiment 5: Consider the system described in example embodiment 1. The input channel estimates $X=[X_1, X_2, \ldots, X_{N_{TX}}]^T$ can represent the estimated channels across a given frequency interval based on the measured CSI-RS.

Embodiment 6: Consider the system described in example embodiment 1. The input channel estimates $X=[X_1, X_2, \ldots, X_{KN_{TX}}]^T$ (i.e, the size of X is ($KN_{TX} \times 1$)), and it constitutes K concatenated measurements/channel estimates for multiple time and/or frequency intervals.

Embodiment 7: Consider the system described in example embodiment 1. The linear part of the encoder can be of the form $U=U_1 U_2$ where $U_1$ can be shared by many UEs (e.g., in a site or network specific manner) and $U_2$ can be configured specifically for the UE. Indeed, the embodiment may generalize the network to have $L_{enc}$ encoding layers and $L_{dec}$ encoding layers with possibly different number of nodes and different activation functions at each layer. The parameters for a given layer can be shared between one or more UEs. In one such embodiment, the $U_1$ part of the encoder is provided as a cell-specific configuration by initial RRC configuration and remains static for the entirety of the UE connection time while the $U_2$ part of the parameters is continuously updated by feedback of training data to and/or from the UE.

Embodiment 8: Consider the system described in example embodiment 1. The UE may change the configured CS compressor $f_{a^*}: \mathbb{C}^N \to \{1, 2, \ldots, M\}$ to a different compressor $f_{\tilde{a}}: \mathbb{C}^N \to \{1, 2, \ldots, M\}$ if it determines that the new CSI compressor $f_{\tilde{a}}$ achieves better distortion (see section 6.2.2). It can measure the performance using the signaled cost function.

Embodiment 9: Consider the system described in example embodiment 1. The BS can choose to update the UE's CSC parameters using, for example, the UE's CSI report (e.g., the rank indicator (RI), channel quality indicator (CQI) or L1-RSRP) or other related variables. For example, the BS can modify the CSC parameters to better match the number of configured CSI-RS ports, the transmission rank, and the channel conditions.

Embodiment 10: Consider the system described in example embodiment 1. In some embodiments the matrices U and/or V may originate from a codebook, hence a limited set of matrices U and/or V are pre-specified, and each matrix is represented by an index in the codebook. By using this index, the gNB and UE may thus exchange information about which U and/or V to be used. Here training may be performed by first relaxing U and V to a continuous parameter space, training (by, for example stochastic gradient decent), and then choosing the closed U and V in the codebook to the trained solution. In another embodiment U and/or V are instead parameterized by a set of parameters and functions; thus, by exchanging these parameters U and/or V are implicitly exchanged.

Embodiment 11: Consider the system described in example embodiment 1. The cost function and CS compressor and decompressor may be optimized with respect to the expected UE throughput, the system cell edge throughput or some other metric relating to system or UE throughput.

Embodiment 12: Consider the system described in example embodiment 1. This optimization may in one embodiment be a continuous or periodic process such that (a*, b*) will be updated when new measurements X[T+1] are obtained. In another embodiment it is rather so that the optimization is performed in an initial phase, based on for example X[1], X[2], ..., X[T], and the set of matrices U and V are then kept fixed. The optimization may be performed in a UE specific way, a sector specific way, a site specific way or a network specific way.

Embodiment 13: Consider the system described in example embodiment 1. In another embodiment the BS measures the channel using reciprocity (e.g., from uplink SRS) and has access to both the CS compressor and decompressor. It may thus perform an optimization of these and signal to the UE which a* (i.e., elements of U) to be used. In one such embodiment the UE does not need to have access to the decompressor.

Embodiment 14: Consider the system described in example embodiment 1. Additionally, the UE reports a preferred transmission rank (RI) as part of the CSI report and instead of using the channel coefficients as input to the encoder, the coefficients of the RI principal eigenvectors are used as input such that $X=[X_1, X_2, \ldots, X_{RI \cdot N_{TX}}]^T$ Embodiment 15: Consider the system described in example embodiment 6. Before inputting the channel estimates to the encoder, a transformation (such as a DFT or a DCT) is applied to the frequency domain channel so as to transform it to delay domain in order to encode the delay domain channel coefficients.

Embodiment 16: Consider the system described in example embodiment 1, with autoencoder replaced by a much more sophisticated network (for example, a deep convolutions neural network with, for example, many millions of parameters). Instead of requiring all UEs to use the same complex deep convolutional neural network, the BS can design one-or-more approximations to complex network tailored for different UEs (e.g., UE types, scheduling configurations etc). In this way, the complexity requirements of the CS compressor can be tailored to the UE capabilities and scheduling requirements.

7. Embodiments of Terminal Devices, Network Nodes, Computer Programs Etc.

Figure 16:
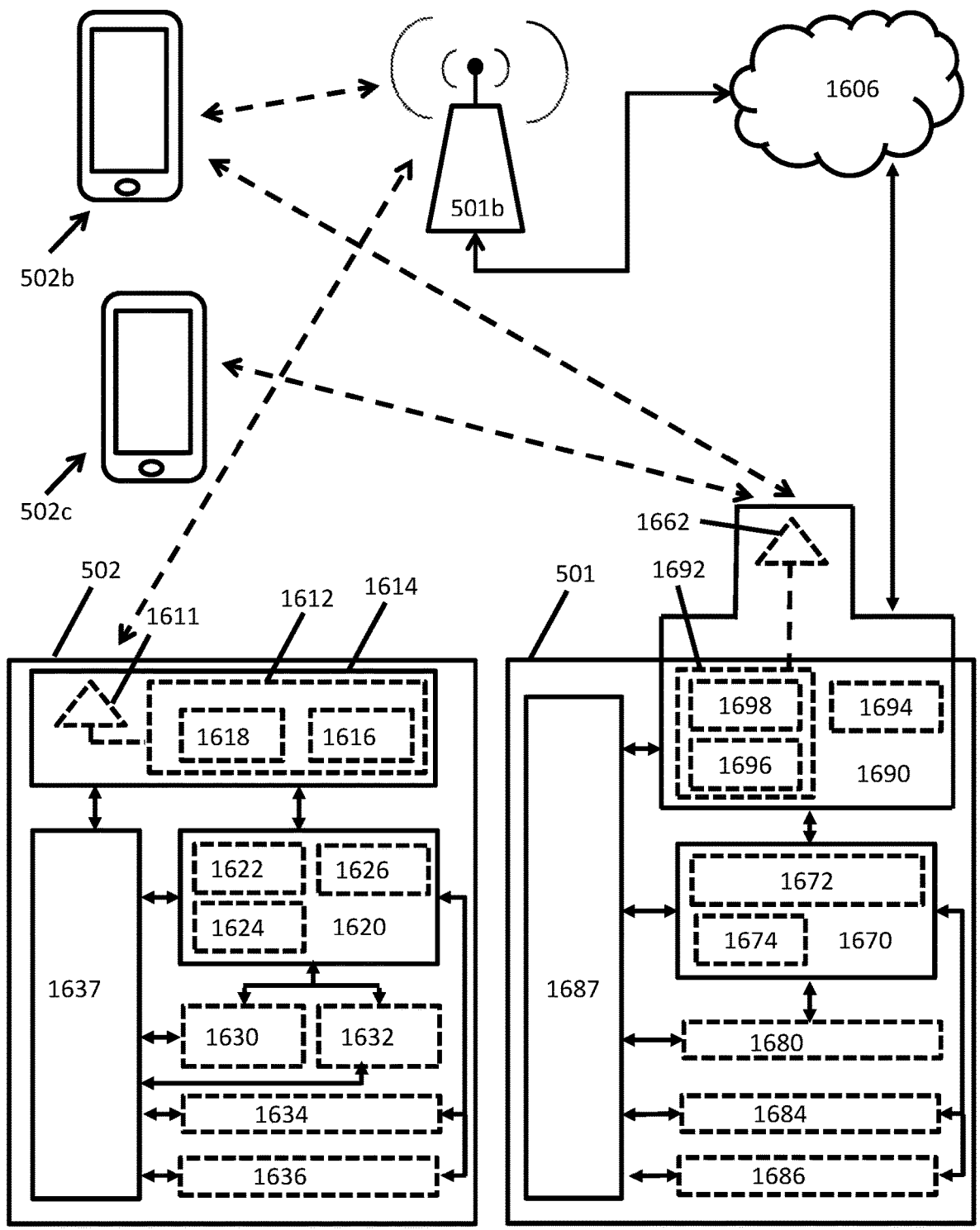
FIG. 16 shows a wireless network in accordance with some embodiments.

The methods of operating a terminal device, described above with reference to FIGS. 1-15 and 17, represent a first aspect of the present disclosure. FIG. 16 shows a wireless network, and will be further described in the next section. The wireless devices 502, 502b and 502c described below with reference to FIG. 16 are examples of terminal devices, and represent a third aspect of the present disclosure. The terminal device 502 (or the processing circuitry 1620 of the terminal device 502) may for example be configured to perform the method of any of the embodiments of the first aspect described above. The terminal device 502 (or the processing circuitry 1620 of the terminal device 502) may for example be configured to perform the method 300 described above with reference to FIG. 3.

According to an embodiment, the terminal device 502 may comprise processing circuitry 1620 and a memory 1630 (or a device-readable medium) containing instructions executable by the processing circuitry 1620 whereby the terminal device 502 is operable to perform the method of any of the embodiments of the first aspect described above.

It will be appreciated that a non-transitory computer-readable medium, such as for example the device-readable medium 1630, may store instructions which, when executed by a computer (or by processing circuitry such as 1620), cause the computer (or the processing circuitry 1620) to perform the method of any of the embodiments of the first aspect described above. It will also be appreciated that a non-transitory computer-readable medium 1630 storing such instructions need not necessarily be comprised in a terminal device 502. On the contrary, such a non-transitory computer-readable medium 1630 could be provided on its own, for example at a location remote from the terminal device 502.

It will be appreciated that the terminal device 502 need not necessarily comprise all those components described below with reference to FIG. 16. For a terminal device 502 according to an embodiment of the third aspect, it is sufficient that the terminal device 502 comprises means for performing the steps of the method of the corresponding embodiment of the first aspect.

Similarly, it will be appreciated that the processing circuitry 1620 need not necessarily comprise all those components described below with reference to FIG. 16.

The methods of operating a network node, described above with reference to FIGS. 1-15 and 17, represent a second aspect of the present disclosure. The network nodes 501 and 501b described below with reference to FIG. 16 represent a fourth aspect of the present disclosure. The network node 501 (or the processing circuitry 1670 of the network node 501) may for example be configured to perform the method of any of the embodiments of the second aspect described above. The network node 501 (or the processing circuitry 1670 of the network node 501) may for example be configured to perform the method 400 described above with reference to FIG. 4.

According to an embodiment, the network node 501 may comprise processing circuitry 1670 and a memory 1680 (or a device-readable medium) containing instructions executable by the processing circuitry 1670 whereby the network node 501 is operable to perform the method of any of the embodiments of the second aspect described above.

It will be appreciated that a non-transitory computer-readable medium, such as for example the device-readable medium 1680, may store instructions which, when executed by a computer (or by processing circuitry such as 1670), cause the computer (or the processing circuitry 1670) to perform the method of any of the embodiments of the second aspect described above. It will also be appreciated that a non-transitory computer-readable medium 1680 storing such instructions need not necessarily be comprised in a network node 501. On the contrary, such a non-transitory computer-readable medium 1680 could be provided on its own, for example at a location remote from the network node 501.

It will be appreciated that the network node 501 need not necessarily comprise all those components described below with reference to FIG. 16. For a network node 501 according to an embodiment of the fourth aspect, it is sufficient that the network node 501 comprises means for performing the steps of the method of the corresponding embodiment of the second aspect.

Similarly, it will be appreciated that the processing circuitry 1670 need not necessarily comprise all those components described below with reference to FIG. 16.

8. Overview of a Wireless Network and Parts Thereof

FIG. 16 shows a wireless network in accordance with some embodiments. Although the subject matter described herein may be implemented in any appropriate type of system using any suitable components, the embodiments disclosed herein are described in relation to a wireless network, such as the example wireless network illustrated in FIG. 16. For simplicity, the wireless network of FIG. 16 only depicts network 1606, network nodes 501 and 501b, and WDs 502, 502b, and 502c. In practice, a wireless network may further include any additional elements suitable to support communication between wireless devices or between a wireless device and another communication device, such as a landline telephone, a service provider, or any other network node or end device. Of the illustrated components, network node 501 and wireless device (WD) 502 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network 1606 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node 501 and WD 502 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 16, network node 501 includes processing circuitry 1670, device readable medium 1680, interface 1690, auxiliary equipment 1684, power source 1686, power circuitry 1687, and antenna 1662. Although network node 501 illustrated in the example wireless network of FIG. 16 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node 501 are depicted as single boxes located within a larger box, or nested within multiple boxes, in practice, a network node may comprise multiple different physical components that make up a single illustrated component (e.g., device readable medium 1680 may comprise multiple separate hard drives as well as multiple RAM modules).

Similarly, network node 501 may be composed of multiple physically separate components (e.g., a NodeB component and a RNC component, or a BTS component and a BSC component, etc.), which may each have their own respective components. In certain scenarios in which network node 501 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node 501 may be configured to support multiple radio access technologies (RATs). In such embodiments, some components may be duplicated (e.g., separate device readable medium 1680 for the different RATs) and some components may be reused (e.g., the same antenna 1662 may be shared by the RATs). Network node 501 may also include multiple sets of the various illustrated components for different wireless technologies integrated into network node 501, such as, for example, GSM, WCDMA, LTE, NR, WiFi, or Bluetooth wireless technologies. These wireless technologies may be integrated into the same or different chip or set of chips and other components within network node 501.

Processing circuitry 1670 is configured to perform any determining, calculating, or similar operations (e.g., certain obtaining operations) described herein as being provided by a network node. These operations performed by processing circuitry 1670 may include processing information obtained by processing circuitry 1670 by, for example, converting the obtained information into other information, comparing the obtained information or converted information to information stored in the network node, and/or performing one or more operations based on the obtained information or converted information, and as a result of said processing making a determination.

Processing circuitry 1670 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node 501 components, such as device readable medium 1680, network node 501 functionality. For example, processing circuitry 1670 may execute instructions stored in device readable medium 1680 or in memory within processing circuitry 1670. Such functionality may include providing any of the various wireless features, functions, or benefits discussed herein. In some embodiments, processing circuitry 1670 may include a system on a chip (SOC).

In some embodiments, processing circuitry 1670 may include one or more of radio frequency (RF) transceiver circuitry 1672 and baseband processing circuitry 1674. In some embodiments, radio frequency (RF) transceiver circuitry 1672 and baseband processing circuitry 1674 may be on separate chips (or sets of chips), boards, or units, such as radio units and digital units. In alternative embodiments, part or all of RF transceiver circuitry 1672 and baseband processing circuitry 1674 may be on the same chip or set of chips, boards, or units In certain embodiments, some or all of the functionality described herein as being provided by a network node, base station, eNB or other such network device may be performed by processing circuitry 1670 executing instructions stored on device readable medium 1680 or memory within processing circuitry 1670. In alternative embodiments, some or all of the functionality may be provided by processing circuitry 1670 without executing instructions stored on a separate or discrete device readable medium, such as in a hard-wired manner. In any of those embodiments, whether executing instructions stored on a device readable storage medium or not, processing circuitry 1670 can be configured to perform the described functionality. The benefits provided by such functionality are not limited to processing circuitry 1670 alone or to other components of network node 501, but are enjoyed by network node 501 as a whole, and/or by end users and the wireless network generally.

Device readable medium 1680 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry 1670. Device readable medium 1680 may store any suitable instructions, data or information, including a computer program, software, an application including one or more of logic, rules, code, tables, etc. and/or other instructions capable of being executed by processing circuitry 1670 and, utilized by network node 501. Device readable medium 1680 may be used to store any calculations made by processing circuitry 1670 and/or any data received via interface 1690. In some embodiments, processing circuitry 1670 and device readable medium 1680 may be considered to be integrated.

Interface 1690 is used in the wired or wireless communication of signalling and/or data between network node 501, network 1606, and/or WDs 502. As illustrated, interface 1690 comprises port(s)/terminal(s) 1694 to send and receive data, for example to and from network 1606 over a wired connection. Interface 1690 also includes radio front end circuitry 1692 that may be coupled to, or in certain embodiments a part of, antenna 1662. Radio front end circuitry 1692 comprises filters 1698 and amplifiers 1696. Radio front end circuitry 1692 may be connected to antenna 1662 and processing circuitry 1670. Radio front end circuitry may be configured to condition signals communicated between antenna 1662 and processing circuitry 1670. Radio front end circuitry 1692 may receive digital data that is to be sent out to other network nodes or WDs via a wireless connection. Radio front end circuitry 1692 may convert the digital data into a radio signal having the appropriate channel and bandwidth parameters using a combination of filters 1698 and/or amplifiers 1696. The radio signal may then be transmitted via antenna 1662. Similarly, when receiving data, antenna 1662 may collect radio signals which are then converted into digital data by radio front end circuitry 1692. The digital data may be passed to processing circuitry 1670. In other embodiments, the interface may comprise different components and/or different combinations of components.

In certain alternative embodiments, network node 501 may not include separate radio front end circuitry 1692, instead, processing circuitry 1670 may comprise radio front end circuitry and may be connected to antenna 1662 without separate radio front end circuitry 1692. Similarly, in some embodiments, all or some of RF transceiver circuitry 1672 may be considered a part of interface 1690. In still other embodiments, interface 1690 may include one or more ports or terminals 1694, radio front end circuitry 1692, and RF transceiver circuitry 1672, as part of a radio unit (not shown), and interface 1690 may communicate with baseband processing circuitry 1674, which is part of a digital unit (not shown).

Antenna 1662 may include one or more antennas, or antenna arrays, configured to send and/or receive wireless signals. Antenna 1662 may be coupled to radio front end circuitry 1690 and may be any type of antenna capable of transmitting and receiving data and/or signals wirelessly. In some embodiments, antenna 1662 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna 1662 may be separate from network node 501 and may be connectable to network node 501 through an interface or port.

Antenna 1662, interface 1690, and/or processing circuitry 1670 may be configured to perform any receiving operations and/or certain obtaining operations described herein as being performed by a network node. Any information, data and/or signals may be received from a wireless device, another network node and/or any other network equipment. Similarly, antenna 1662, interface 1690, and/or processing circuitry 1670 may be configured to perform any transmitting operations described herein as being performed by a network node. Any information, data and/or signals may be transmitted to a wireless device, another network node and/or any other network equipment.

Power circuitry 1687 may comprise, or be coupled to, power management circuitry and is configured to supply the components of network node 501 with power for performing the functionality described herein. Power circuitry 1687 may receive power from power source 1686. Power source 1686 and/or power circuitry 1687 may be configured to provide power to the various components of network node 501 in a form suitable for the respective components (e.g., at a voltage and current level needed for each respective component). Power source 1686 may either be included in or external to, power circuitry 1687 and/or network node 501. For example, network node 501 may be connectable to an external power source (e.g., an electricity outlet) via an input circuitry or interface such as an electrical cable, whereby the external power source supplies power to power circuitry 1687. As a further example, power source 1686 may comprise a source of power in the form of a battery or battery pack which is connected to, or integrated in, power circuitry 1687. The battery may provide backup power should the external power source fail. Other types of power sources, such as photovoltaic devices, may also be used.

Alternative embodiments of network node 501 may include additional components beyond those shown in FIG. 16 that may be responsible for providing certain aspects of the network node's functionality, including any of the functionality described herein and/or any functionality necessary to support the subject matter described herein. For example, network node 501 may include user interface equipment to allow input of information into network node 501 and to allow output of information from network node 501. This may allow a user to perform diagnostic, maintenance, repair, and other administrative functions for network node 501.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE) or terminal device. Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a UE implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device 502 includes antenna 1611, interface 1614, processing circuitry 1620, device readable medium 1630, user interface equipment 1632, auxiliary equipment 1634, power source 1636 and power circuitry 1637. WD 502 may include multiple sets of one or more of the illustrated components for different wireless technologies supported by WD 502, such as, for example, GSM, WCDMA, LTE, NR, WiFi, WiMAX, or Bluetooth wireless technologies, just to mention a few. These wireless technologies may be integrated into the same or different chips or set of chips as other components within WD 502.

Antenna 1611 may include one or more antennas or antenna arrays, configured to send and/or receive wireless signals, and is connected to interface 1614. In certain alternative embodiments, antenna 1611 may be separate from WD 502 and be connectable to WD 502 through an interface or port. Antenna 1611, interface 1614, and/or processing circuitry 1620 may be configured to perform any receiving or transmitting operations described herein as being performed by a WD. Any information, data and/or signals may be received from a network node and/or another WD. In some embodiments, radio front end circuitry and/or antenna 1611 may be considered an interface.

As illustrated, interface 1614 comprises radio front end circuitry 1612 and antenna 1611. Radio front end circuitry 1612 comprise one or more filters 1618 and amplifiers 1616. Radio front end circuitry 1614 is connected to antenna 1611 and processing circuitry 1620, and is configured to condition signals communicated between antenna 1611 and processing circuitry 1620. Radio front end circuitry 1612 may be coupled to or a part of antenna 1611. In some embodiments, WD 502 may not include separate radio front end circuitry 1612; rather, processing circuitry 1620 may comprise radio front end circuitry and may be connected to antenna 1611. Similarly, in some embodiments, some or all of RF transceiver circuitry 1622 may be considered a part of interface 1614. Radio front end circuitry 1612 may receive digital data that is to be sent out to other network nodes or WDs via a wireless connection. Radio front end circuitry 1612 may convert the digital data into a radio signal having the appropriate channel and bandwidth parameters using a combination of filters 1618 and/or amplifiers 1616. The radio signal may then be transmitted via antenna 1611. Similarly, when receiving data, antenna 1611 may collect radio signals which are then converted into digital data by radio front end circuitry 1612. The digital data may be passed to processing circuitry 1620. In other embodiments, the interface may comprise different components and/or different combinations of components.

Processing circuitry 1620 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD 502 components, such as device readable medium 1630, WD 502 functionality. Such functionality may include providing any of the various wireless features or benefits discussed herein. For example, processing circuitry 1620 may execute instructions stored in device readable medium 1630 or in memory within processing circuitry 1620 to provide the functionality disclosed herein.

As illustrated, processing circuitry 1620 includes one or more of RF transceiver circuitry 1622, baseband processing circuitry 1624, and application processing circuitry 1626. In other embodiments, the processing circuitry may comprise different components and/or different combinations of components. In certain embodiments processing circuitry 1620 of WD 502 may comprise a SOC. In some embodiments, RF transceiver circuitry 1622, baseband processing circuitry 1624, and application processing circuitry 1626 may be on separate chips or sets of chips. In alternative embodiments, part or all of baseband processing circuitry 1624 and application processing circuitry 1626 may be combined into one chip or set of chips, and RF transceiver circuitry 1622 may be on a separate chip or set of chips. In still alternative embodiments, part or all of RF transceiver circuitry 1622 and baseband processing circuitry 1624 may be on the same chip or set of chips, and application processing circuitry 1626 may be on a separate chip or set of chips. In yet other alternative embodiments, part or all of RF transceiver circuitry 1622, baseband processing circuitry 1624, and application processing circuitry 1626 may be combined in the same chip or set of chips. In some embodiments, RF transceiver circuitry 1622 may be a part of interface 1614. RF transceiver circuitry 1622 may condition RF signals for processing circuitry 1620.

In certain embodiments, some or all of the functionality described herein as being performed by a WD may be provided by processing circuitry 1620 executing instructions stored on device readable medium 1630, which in certain embodiments may be a computer-readable storage medium. In alternative embodiments, some or all of the functionality may be provided by processing circuitry 1620 without executing instructions stored on a separate or discrete device readable storage medium, such as in a hard-wired manner. In any of those particular embodiments, whether executing instructions stored on a device readable storage medium or not, processing circuitry 1620 can be configured to perform the described functionality. The benefits provided by such functionality are not limited to processing circuitry 1620 alone or to other components of WD 502, but are enjoyed by WD 502 as a whole, and/or by end users and the wireless network generally.

Processing circuitry 1620 may be configured to perform any determining, calculating, or similar operations (e.g., certain obtaining operations) described herein as being performed by a WD. These operations, as performed by processing circuitry 1620, may include processing information obtained by processing circuitry 1620 by, for example, converting the obtained information into other information, comparing the obtained information or converted information to information stored by WD 502, and/or performing one or more operations based on the obtained information or converted information, and as a result of said processing making a determination.

Device readable medium 1630 may be operable to store a computer program, software, an application including one or more of logic, rules, code, tables, etc. and/or other instructions capable of being executed by processing circuitry 1620. Device readable medium 1630 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry 1620. In some embodiments, processing circuitry 1620 and device readable medium 1630 may be considered to be integrated.

User interface equipment 1632 may provide components that allow for a human user to interact with WD 502. Such interaction may be of many forms, such as visual, audial, tactile, etc. User interface equipment 1632 may be operable to produce output to the user and to allow the user to provide input to WD 502. The type of interaction may vary depending on the type of user interface equipment 1632 installed in WD 502. For example, if WD 502 is a smart phone, the interaction may be via a touch screen; if WD 502 is a smart meter, the interaction may be through a screen that provides usage (e.g., the number of gallons used) or a speaker that provides an audible alert (e.g., if smoke is detected). User interface equipment 1632 may include input interfaces, devices and circuits, and output interfaces, devices and circuits. User interface equipment 1632 is configured to allow input of information into WD 502, and is connected to processing circuitry 1620 to allow processing circuitry 1620 to process the input information. User interface equipment 1632 may include, for example, a microphone, a proximity or other sensor, keys/buttons, a touch display, one or more cameras, a USB port, or other input circuitry. User interface equipment 1632 is also configured to allow output of information from WD 502, and to allow processing circuitry 1620 to output information from WD 502. User interface equipment 1632 may include, for example, a speaker, a display, vibrating circuitry, a USB port, a headphone interface, or other output circuitry. Using one or more input and output interfaces, devices, and circuits, of user interface equipment 1632, WD 502 may communicate with end users and/or the wireless network, and allow them to benefit from the functionality described herein.

Auxiliary equipment 1634 is operable to provide more specific functionality which may not be generally performed by WDs. This may comprise specialized sensors for doing measurements for various purposes, interfaces for additional types of communication such as wired communications etc. The inclusion and type of components of auxiliary equipment 1634 may vary depending on the embodiment and/or scenario.

Power source 1636 may, in some embodiments, be in the form of a battery or battery pack. Other types of power sources, such as an external power source (e.g., an electricity outlet), photovoltaic devices or power cells, may also be used. WD 502 may further comprise power circuitry 1637 for delivering power from power source 1636 to the various parts of WD 502 which need power from power source 1636 to carry out any functionality described or indicated herein. Power circuitry 1637 may in certain embodiments comprise power management circuitry. Power circuitry 1637 may additionally or alternatively be operable to receive power from an external power source; in which case WD 502 may be connectable to the external power source (such as an electricity outlet) via input circuitry or an interface such as an electrical power cable. Power circuitry 1637 may also in certain embodiments be operable to deliver power from an external power source to power source 1636. This may be, for example, for the charging of power source 1636. Power circuitry 1637 may perform any formatting, converting, or other modification to the power from power source 1636 to make the power suitable for the respective components of WD 502 to which power is supplied.

9. Miscellaneous

The person skilled in the art realizes that the proposed approach presented in the present disclosure is by no means limited to the preferred embodiments described above. On the contrary, many modifications and variations are possible. For example, the methods described above with reference to FIGS. 3-15 may be combined to form further embodiments. Further, it will be appreciated that the terminal device 502 and the network node 501 shown in FIG. 16 are merely intended as examples, and that other terminal devices and network nodes may also perform the methods described above with reference to FIGS. 3-15. It will also be appreciated that the method steps described with reference to FIGS. 7-11 need not necessarily be performed in the specific order shown in these figures, unless otherwise indicated.

The system 1500 described above with reference to FIG. 15 is intended as a simple example to illustrate the proposed compression concept. It will be appreciated that a larger system (for example using additional layers of nodes) may provide better performance.

It will be appreciated that the term radio access technology, or RAT, employed herein may refer to any RAT e.g. UTRA, E-UTRA, narrow band internet of things (NB-IoT), WiFi, Bluetooth, next generation RAT (NR), 4G, 5G, etc. The network nodes and terminal devices described herein may be capable of supporting a single or multiple RATs.

Additionally, variations to the disclosed embodiments can be understood and effected by those skilled in the art. It will be appreciated that the word "comprising" does not exclude other elements or steps, and that the indefinite article "a" or "an" does not exclude a plurality. The word "or" is not to be interpreted as an exclusive or (sometimes referred to as "XOR"). On the contrary, expressions such as "A or B" covers all the cases "A and not B", "B and not A" and "A and B". The mere fact that certain measures are recited in mutually different dependent embodiments does not indicate that a combination of these measures cannot be used to advantage.

REFERENCES

Candes, E., Romberg, J., & Tao, T. (2006). Robust uncertainty principles: Exact signal reconstruction from highly incomplete frequency information. IEEE Trans Information Theory, 52(2).

Ericsson. (2018). IMT2020 self-evaluations: On eMBB spectral efficiency with NR. Sanya China: 3GPP R1-1805228.

Kuo, P.-H., Kung, H. T., & Ting, P.-A. (2012). Compressive sensing based channel feedback protocols for spatially-correlated massive antenna arrays. IEEE Wireless Communication Network Conf, (pp. 492-497).

What is claimed is:

1. A method of operating a user equipment (UE), the method comprising:
receiving a first set of parameters from a network node;
compressing downlink channel estimates using a compression function; and
transmitting the compressed downlink channel estimates,
wherein the compression function comprises a neural network having:
a linear function;
a non-linear function; and
a quantizer,
wherein the linear function is based on at least one of the parameters from the first set of parameters,
wherein the linear function is configured to:
receive input data; and
provide output data with a lower dimension than the input data,
wherein the non-linear function is configured to apply a non-linear activation function to each of a plurality of numbers in the output data of the linear function,
wherein the quantizer is configured to:
receive a plurality of numbers from the non-linear function; and
apply scalar quantizers to the received numbers.

2. The method of claim 1, wherein the compression function comprises an alternating sequence of a first type of functions and a second type of functions, wherein at least one of the first type of functions is based on parameters from the first set of parameters, and wherein the second type of functions are non-linear functions.

3. The method of claim 2, wherein:
an order of the functions in the alternating sequence of the first type of functions and the second type of functions is predefined;
the first type of functions are linear functions or are functions comprising a linear portion and a constant portion; and
the second type of functions are predefined,
wherein the quantizer is configured to:
receive a plurality of numbers; and
apply scalar quantizers to the received numbers.

4. The method of claim 1, further comprising:
receiving a second set of parameters, the second set of parameters indicating a decompression function for decompressing downlink channel estimates which have been compressed using the compression function;
determining, based on the first set of parameters and the second set of parameters, an updated value for at least one parameter from the first set of parameters;
forming an updated compression function based on the updated value;
compressing downlink channel estimates using the updated compression function; and
transmitting the downlink channel estimates compressed using the updated compression function.

5. The method of claim 4, further comprising:
receiving a third set of one or more parameters, the third set of one or more parameters indicating an objective function for evaluating performance of the compression function,
wherein the updated value for at least one parameter from the first set of parameters is determined using the objective function,
the method further comprising:
determining, based on the first set of parameters and the second set of parameters, an updated value for at least one parameter from the second set of parameters; and
transmitting the updated value for at least one parameter from the second set of parameters.

6. The method of claim 1, wherein the downlink channel estimates comprise information about channels from antenna ports of the network node to antenna ports of the UE, the method further comprising:
determining the downlink channel estimates using downlink reference signals.

7. A method of operating a network node, the method comprising:
determining a first set of parameters, the first set of parameters indicating a compression function for compressing downlink channel estimates at a user equipment (UE);
determining a decompression function for decompressing downlink channel estimates which have been compressed by the UE using the compression function;
transmitting the first set of parameters;
receiving compressed downlink channel estimates; and
decompressing the compressed downlink channel estimates using the decompression function,
wherein the decompression function comprises a neural network having:
a linear function; and
a non-linear function,
wherein determining the decompression function comprises:
determining the linear function,
wherein the first function is configured to:
receive input data and
provide output data in a higher dimensional space than the input data,
wherein the non-linear function is configured to apply a non-linear activation function to each of a plurality of numbers in the output data of the linear function.

8. The method of claim 7, wherein:
the second function is predefined.

9. The method of claim 7, wherein the decompression function comprises an alternating sequence of a first type of functions and a second type of functions, wherein the second type of functions are non-linear functions, and wherein determining the decompression function comprises:
determining at least one of the first type of functions.

10. The method of claim 9, wherein:
an order of the functions in the alternating sequence of the first type of functions and the second type of functions is predefined;
the first type of functions are linear functions or are functions comprising a linear portion and a constant portion; and the second type of functions are predefined.

11. The method of claim 7, wherein the first set of parameters and the decompression function are determined based on:
information about the terminal device; and/or
information about the network node; and/or
information about a cell of the network node.

12. The method of claim 7, wherein the first set of parameters and the decompression function are determined based on at least one of:
a position of the network node;
a position of the terminal device;
an expected pathloss for the terminal device;
a precoding method used by the network node;
a type of preceding used to transmit downlink reference signals; or
a time and/or frequency granularity of channel state information (CSI) related measurements and reporting.

13. The method of claim 7, wherein determining the decompression function comprises:
determining a second set of parameters; and
forming the decompression function based on the second set of parameters, wherein the first set of parameters and the second set of parameters are determined by at least:
evaluating performance of different compression functions and decompression functions using an objective function; and
selecting values for the first set of parameter and the second set of parameters based on the evaluation,
wherein the evaluation is performed using one or more neural networks, and wherein the first set of parameters and the second set of parameters correspond to weights in the one or more neural networks.

14. A user equipment (UE) comprising:
processing circuitry;
and at least one memory, the at least one memory containing instructions that when executed by the processing circuitry cause the UE to:
receive a first set of parameters from a network node;
form a compression function based on the first set of parameters;
compress downlink channel estimates using the compression function; and
transmit the compressed downlink channel estimates,
wherein the compression function comprises a neural network having:
a linear function;
a non-linear function; and
a quantizer,
wherein the linear function is formed based on at least one of the parameters from the first set of parameters, wherein the linear function is configured to:
  receive input data; and
  provide output data with a lower dimension than the input data,
wherein the non-linear function is configured to apply a non-linear activation function to each of a plurality of numbers in the output data of the linear function,
wherein the quantizer is configured to:
  receive a plurality of numbers from the non-linear function; and
  apply scalar quantizers to the received numbers.

15. A network node comprising:
processing circuitry; and
at least one memory, the at least one memory containing instructions that when by the processing circuitry cause the network node to:
  determine a first set of parameters, the first set of parameters indicating a compression function for compressing downlink channel estimates at a user equipment (UE);
  determine a decompression function for decompressing downlink channel estimates which have been compressed by the UE using the compression function;
  transmit the first set of parameters;
  receive compressed downlink channel estimates; and
  decompress the compressed downlink channel estimates using the decompression function,
wherein the decompression function comprises a neural network having:
  a linear function; and
  a non-linear function,
wherein determining the decompression function comprises:
  determining the linear function,
wherein the linear function is configured to:
  receive input data and
  provide output data in a higher dimensional space than the input data,
wherein the non-linear function is configured to apply a non-linear activation function to each of a plurality of numbers in the output data of the linear function.

* * * * *